US012558708B2

(12) United States Patent
Li et al.

(10) Patent No.: US 12,558,708 B2
(45) Date of Patent: Feb. 24, 2026

(54) ARRAY ARCHITECTURE AND INTERCONNECTION FOR TRANSDUCERS

(71) Applicant: FUJIFILM SonoSite, Inc.

(72) Inventors: Wei Li, Bothell, WA (US); Jimin Zhang, Bothell, WA (US)

(73) Assignee: FUJIFILM SONOSITE, INC., Bothell, WA (US)

( * ) Notice: Subject to any disclaimer, the term of this patent is extended or adjusted under 35 U.S.C. 154(b) by 942 days.

(21) Appl. No.: 17/561,313

(22) Filed: Dec. 23, 2021

(65) Prior Publication Data

US 2023/0201876 A1      Jun. 29, 2023

(51) Int. Cl.
B06B 1/06          (2006.01)
H10N 30/088        (2023.01)

(52) U.S. Cl.
CPC ............ B06B 1/0622 (2013.01); B06B 1/067 (2013.01); H10N 30/088 (2023.02)

(58) Field of Classification Search
CPC .............................. B06B 1/0622; B06B 1/067
See application file for complete search history.

(56) References Cited

U.S. PATENT DOCUMENTS

| | | | |
|---|---|---|---|
| 4,490,640 A | 12/1984 | Honda | |
| 5,361,767 A | 11/1994 | Yukov | |
| 5,655,535 A | 8/1997 | Friemel et al. | |
| 6,234,967 B1 | 5/2001 | Powers | |
| 6,312,383 B1 | 11/2001 | Lizzi et al. | |
| 6,443,900 B2 | 9/2002 | Adachi et al. | |
| 6,464,638 B1 | 10/2002 | Adams et al. | |
| 6,540,683 B1 | 4/2003 | Lin | |

(Continued)

FOREIGN PATENT DOCUMENTS

| | | |
|---|---|---|
| CN | 112414601 A | 2/2021 |
| WO | 2001056474 A1 | 8/2001 |

(Continued)

OTHER PUBLICATIONS

English Translation of CN 112414601 (Year: 2021).*
International Search Report and Written Opinion of International Application No. PCT/US2022/082339, 80 Pages, Apr. 12, 2023.

*Primary Examiner* — Bryan P Gordon
(74) *Attorney, Agent, or Firm* — Womble Bond Dickinson (US) LLP

(57)          ABSTRACT

A method of fabricating a transducer includes embedding signal flexes and ground-return flexes inside a backing block. The method includes forming stack configurations with a height in elevation and a width perpendicular to the height. The forming includes: dicing a piezoelectric layer in the elevation into rows (separating the piezoelectric layer into portions); defining a beam pattern for the transducer by aligning the portions on the backing block; and forming gaps in-between each piezoelectric layer portion and each adjacently aligned piezoelectric layer portion. The method includes forming stacks by bonding one or more matching layers to the piezoelectric layer portions by utilizing a conductive surface of a first matching layer of the one or more matching layers. The method also includes forming cavities in the one or more matching layers in elevation, dicing the stacks along an elevation direction into multiple elements, and filling the cavities with a material.

20 Claims, 19 Drawing Sheets

200

(56) References Cited

U.S. PATENT DOCUMENTS

| | | | |
|---|---|---|---|
| 6,558,331 | B1 | 5/2003 | Davidsen et al. |
| 6,692,439 | B1 | 2/2004 | Walker et al. |
| 6,726,629 | B1 | 4/2004 | Frinking et al. |
| 7,443,081 | B2 | 10/2008 | Kamei et al. |
| 7,771,418 | B2 | 8/2010 | Chopra et al. |
| 7,995,820 | B2 | 8/2011 | Carneiro et al. |
| 8,116,548 | B2 | 2/2012 | Zheng et al. |
| 8,235,899 | B2 | 8/2012 | Hashiba |
| 8,540,638 | B2 | 9/2013 | Gourevitch |
| 8,556,814 | B2 | 10/2013 | Carneiro et al. |
| 8,771,189 | B2 | 7/2014 | Ionasec et al. |
| 9,052,396 | B2 | 6/2015 | Shen |
| 9,532,769 | B2 | 1/2017 | Dayton et al. |
| 9,561,357 | B2 | 2/2017 | Hall et al. |
| 9,785,858 | B2 | 10/2017 | Seifert et al. |
| 9,984,450 | B2 | 5/2018 | Fleischer et al. |
| 9,986,977 | B2 | 6/2018 | Kim et al. |
| 10,172,591 | B2 | 1/2019 | Kiyose et al. |
| 10,188,369 | B2 | 1/2019 | Pelissier et al. |
| 10,226,235 | B2 | 3/2019 | Deng et al. |
| 10,451,733 | B2 | 10/2019 | Beers et al. |
| 10,881,377 | B2 | 1/2021 | Ebrahimi et al. |
| 10,905,401 | B2 | 2/2021 | Li et al. |
| 11,045,166 | B2 | 6/2021 | Gerbaulet et al. |
| 11,134,919 | B2 | 10/2021 | Pelissier et al. |
| 11,143,547 | B2 | 10/2021 | Akkaraju et al. |
| 11,169,265 | B2 | 11/2021 | Pang et al. |
| 11,402,503 | B2 | 8/2022 | Beers et al. |
| 11,402,504 | B2 | 8/2022 | Holbek et al. |
| 11,426,611 | B2 | 8/2022 | Watson et al. |
| 11,446,001 | B2 | 9/2022 | Rothberg et al. |
| 11,465,176 | B2 | 10/2022 | Chaggares et al. |
| 11,547,386 | B1 | 1/2023 | Roy et al. |
| 11,583,253 | B2 | 2/2023 | Foster et al. |
| 11,607,194 | B2 | 3/2023 | Owen et al. |
| 11,690,598 | B2 | 7/2023 | Imamura |
| 11,754,534 | B2 | 9/2023 | Kim et al. |
| 11,937,975 | B2 | 3/2024 | Baram et al. |
| 11,976,433 | B2 | 5/2024 | Beardsley et al. |
| 11,998,391 | B1 | 6/2024 | Roy et al. |
| 2004/0100163 | A1 | 5/2004 | Baumgartner et al. |
| 2006/0058672 | A1 | 3/2006 | Klepper |
| 2006/0253028 | A1 | 11/2006 | Lam et al. |
| 2008/0304729 | A1 | 12/2008 | Peszynski |
| 2010/0262013 | A1 | 10/2010 | Smith et al. |
| 2011/0230766 | A1 | 9/2011 | Medlin |
| 2013/0065211 | A1 | 3/2013 | Amso et al. |
| 2014/0180108 | A1 | 6/2014 | Rice |
| 2017/0065253 | A1* | 3/2017 | Li ..................... B06B 1/0644 |
| 2018/0206824 | A1 | 7/2018 | Taniguchi |
| 2018/0310922 | A1 | 11/2018 | Pelissier et al. |
| 2019/0084004 | A1* | 3/2019 | Chartrand ............ B06B 1/0622 |
| 2019/0133550 | A1 | 5/2019 | Liu et al. |
| 2019/0328360 | A1 | 10/2019 | Ferin et al. |
| 2020/0107814 | A1 | 4/2020 | Daloz et al. |
| 2020/0386719 | A1 | 12/2020 | Park et al. |
| 2023/0082716 | A1* | 3/2023 | Jung ..................... B06B 1/0677 |
| | | | 600/459 |
| 2023/0161020 | A1 | 5/2023 | Jacobs |
| 2023/0165564 | A1 | 6/2023 | Nally et al. |
| 2023/0201876 | A1* | 6/2023 | Li ..................... B06B 1/0629 |
| | | | 310/334 |
| 2023/0311161 | A1 | 10/2023 | Najar et al. |
| 2023/0380813 | A1 | 11/2023 | Zhu et al. |
| 2024/0008840 | A1 | 1/2024 | Hao |
| 2024/0016476 | A1 | 1/2024 | Pang et al. |
| 2024/0050068 | A1 | 2/2024 | Pang et al. |
| 2024/0165666 | A1 | 5/2024 | Hynynen et al. |

FOREIGN PATENT DOCUMENTS

| | | |
|---|---|---|
| WO | 2002052544 A2 | 4/2002 |
| WO | 2021167274 A1 | 8/2021 |

* cited by examiner

500

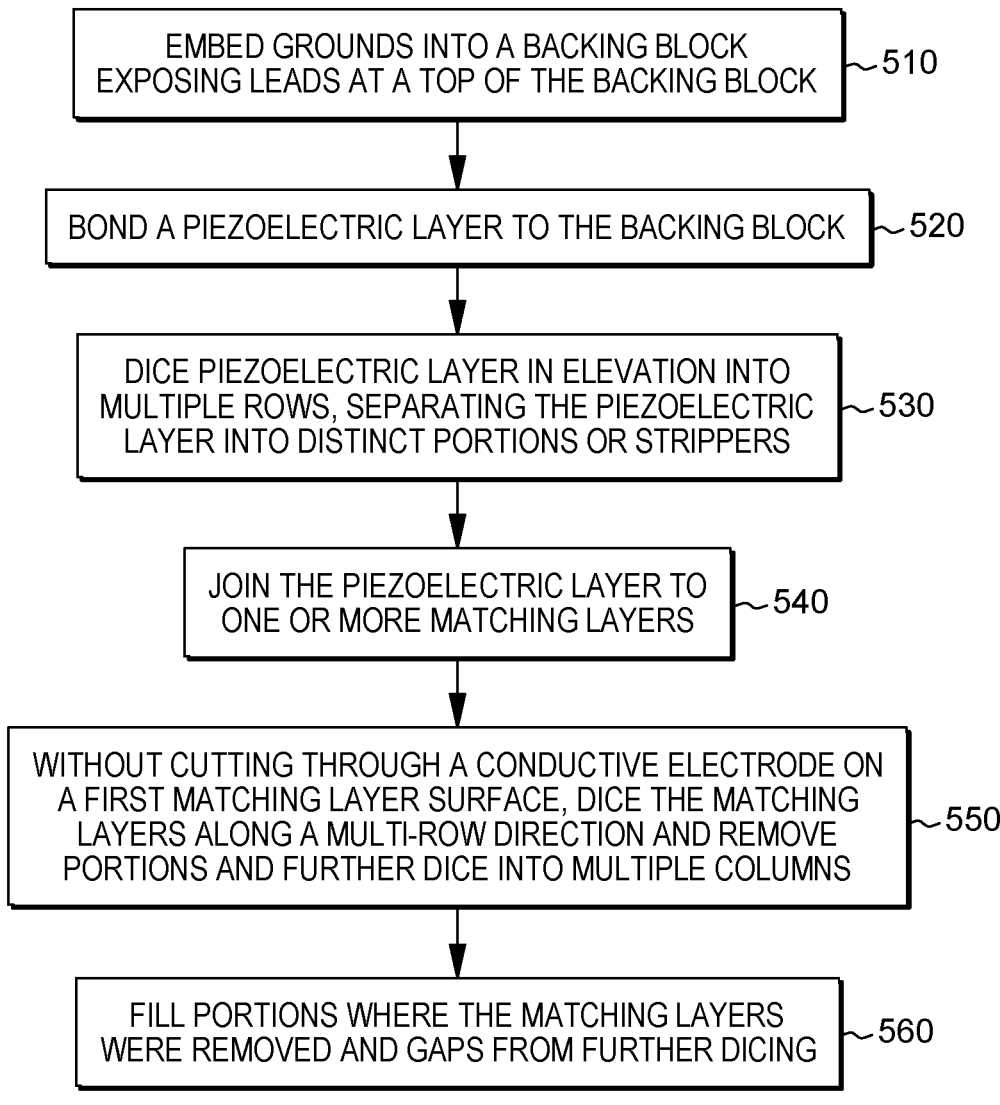

EMBED GROUNDS INTO A BACKING BLOCK EXPOSING LEADS AT A TOP OF THE BACKING BLOCK ~510

BOND A PIEZOELECTRIC LAYER TO THE BACKING BLOCK ~520

DICE PIEZOELECTRIC LAYER IN ELEVATION INTO MULTIPLE ROWS, SEPARATING THE PIEZOELECTRIC LAYER INTO DISTINCT PORTIONS OR STRIPPERS ~530

JOIN THE PIEZOELECTRIC LAYER TO ONE OR MORE MATCHING LAYERS ~540

WITHOUT CUTTING THROUGH A CONDUCTIVE ELECTRODE ON A FIRST MATCHING LAYER SURFACE, DICE THE MATCHING LAYERS ALONG A MULTI-ROW DIRECTION AND REMOVE PORTIONS AND FURTHER DICE INTO MULTIPLE COLUMNS ~550

FILL PORTIONS WHERE THE MATCHING LAYERS WERE REMOVED AND GAPS FROM FURTHER DICING ~560

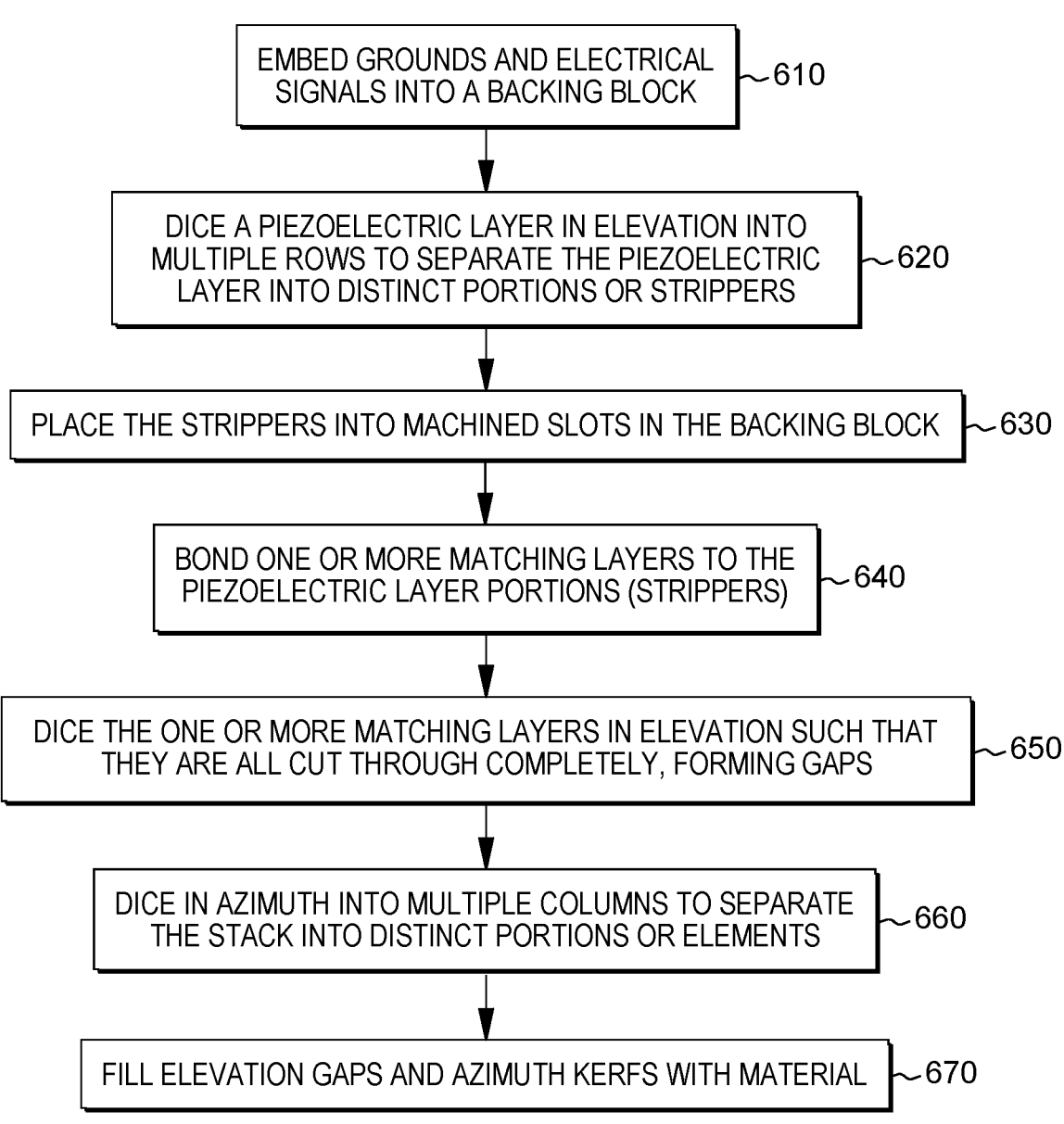

EMBED GROUNDS AND ELECTRICAL
SIGNALS INTO A BACKING BLOCK ~610

DICE A PIEZOELECTRIC LAYER IN ELEVATION INTO
MULTIPLE ROWS TO SEPARATE THE PIEZOELECTRIC
LAYER INTO DISTINCT PORTIONS OR STRIPPERS ~620

PLACE THE STRIPPERS INTO MACHINED SLOTS IN THE BACKING BLOCK ~630

BOND ONE OR MORE MATCHING LAYERS TO THE
PIEZOELECTRIC LAYER PORTIONS (STRIPPERS) ~640

DICE THE ONE OR MORE MATCHING LAYERS IN ELEVATION SUCH THAT
THEY ARE ALL CUT THROUGH COMPLETELY, FORMING GAPS ~650

DICE IN AZIMUTH INTO MULTIPLE COLUMNS TO SEPARATE
THE STACK INTO DISTINCT PORTIONS OR ELEMENTS ~660

FILL ELEVATION GAPS AND AZIMUTH KERFS WITH MATERIAL ~670

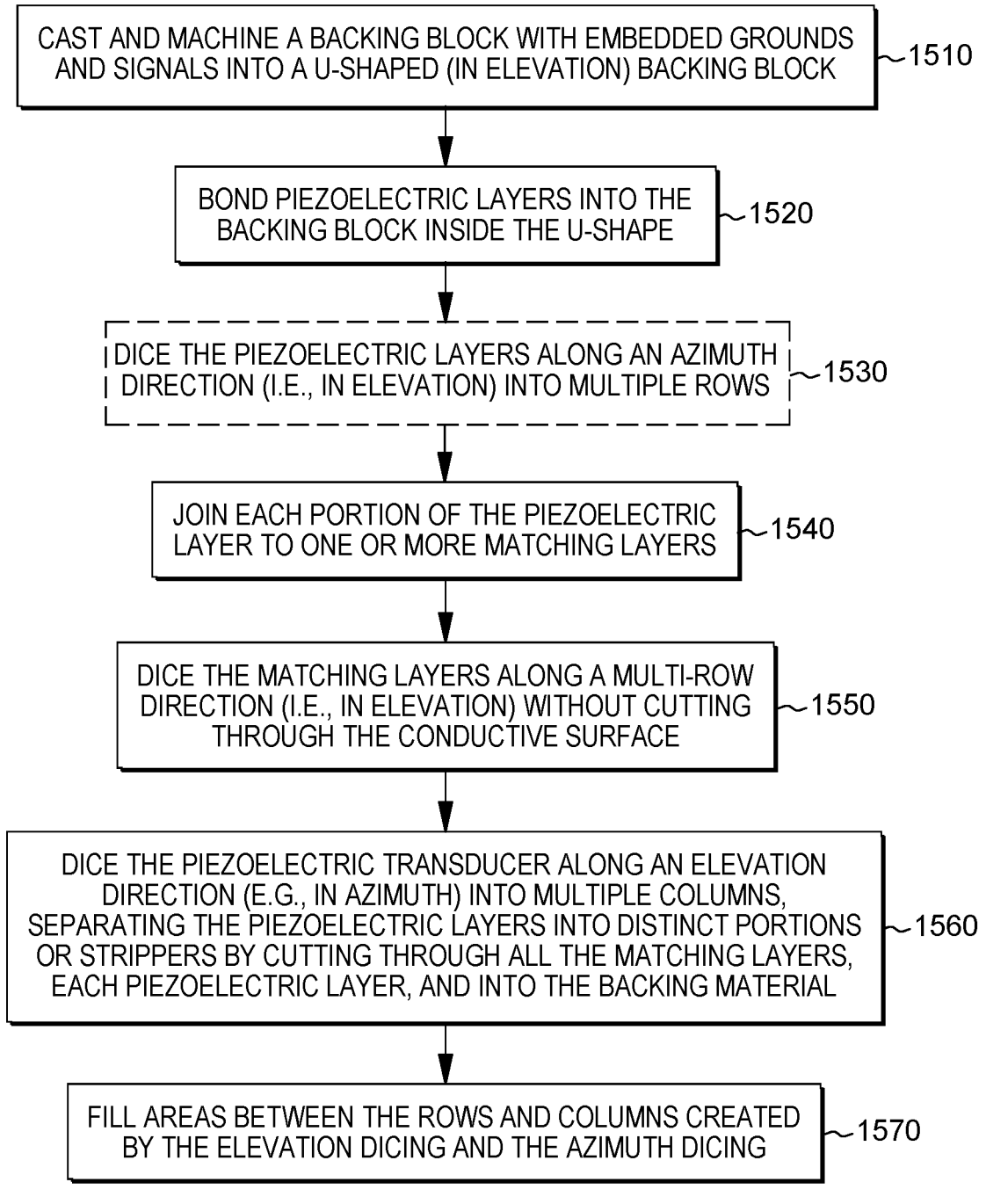

1500

CAST AND MACHINE A BACKING BLOCK WITH EMBEDDED GROUNDS AND SIGNALS INTO A U-SHAPED (IN ELEVATION) BACKING BLOCK ~1510

BOND PIEZOELECTRIC LAYERS INTO THE BACKING BLOCK INSIDE THE U-SHAPE ~1520

DICE THE PIEZOELECTRIC LAYERS ALONG AN AZIMUTH DIRECTION (I.E., IN ELEVATION) INTO MULTIPLE ROWS ~1530

JOIN EACH PORTION OF THE PIEZOELECTRIC LAYER TO ONE OR MORE MATCHING LAYERS ~1540

DICE THE MATCHING LAYERS ALONG A MULTI-ROW DIRECTION (I.E., IN ELEVATION) WITHOUT CUTTING THROUGH THE CONDUCTIVE SURFACE ~1550

DICE THE PIEZOELECTRIC TRANSDUCER ALONG AN ELEVATION DIRECTION (E.G., IN AZIMUTH) INTO MULTIPLE COLUMNS, SEPARATING THE PIEZOELECTRIC LAYERS INTO DISTINCT PORTIONS OR STRIPPERS BY CUTTING THROUGH ALL THE MATCHING LAYERS, EACH PIEZOELECTRIC LAYER, AND INTO THE BACKING MATERIAL ~1560

FILL AREAS BETWEEN THE ROWS AND COLUMNS CREATED BY THE ELEVATION DICING AND THE AZIMUTH DICING ~1570

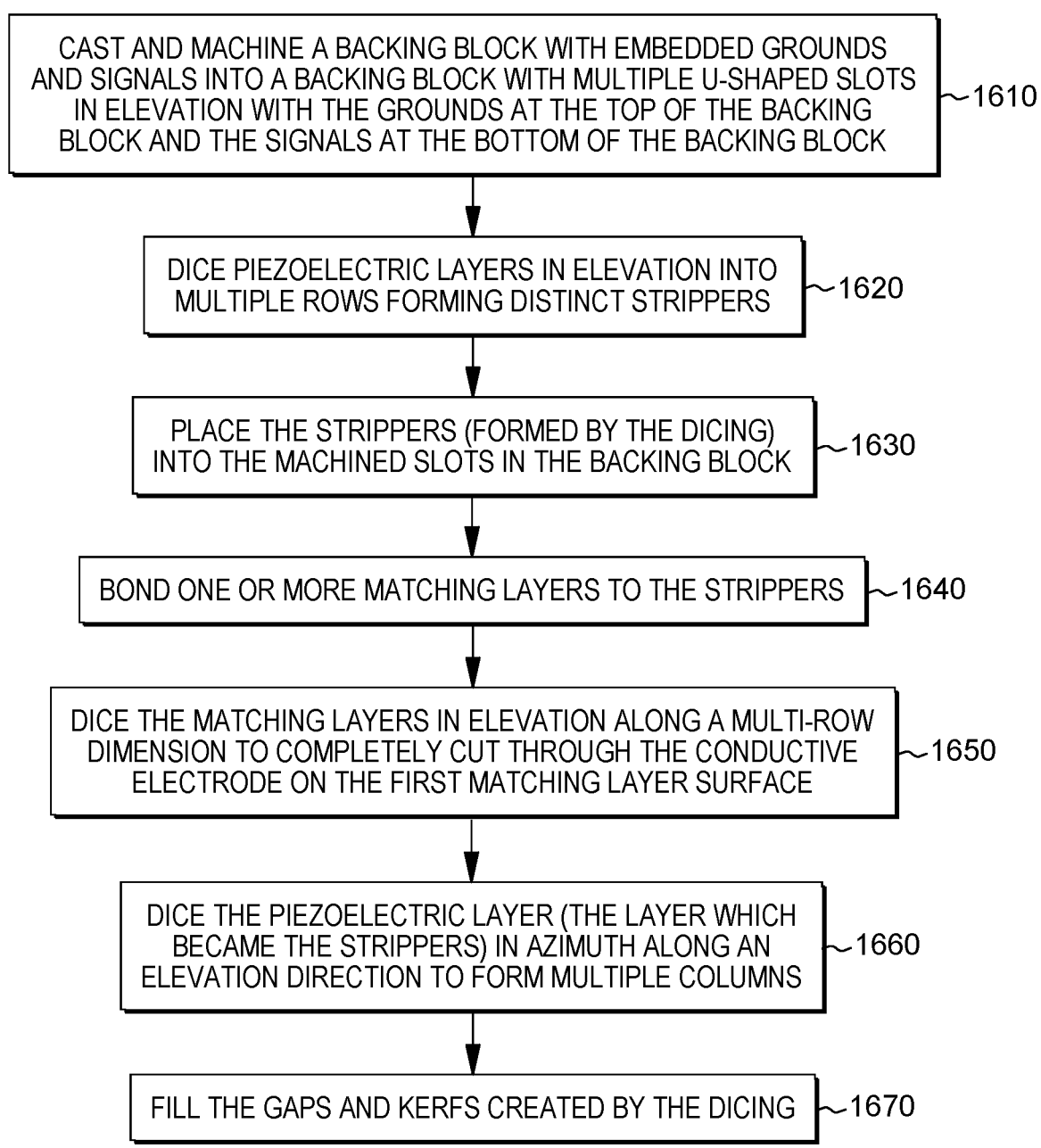

CAST AND MACHINE A BACKING BLOCK WITH EMBEDDED GROUNDS AND SIGNALS INTO A BACKING BLOCK WITH MULTIPLE U-SHAPED SLOTS IN ELEVATION WITH THE GROUNDS AT THE TOP OF THE BACKING BLOCK AND THE SIGNALS AT THE BOTTOM OF THE BACKING BLOCK ~1610

DICE PIEZOELECTRIC LAYERS IN ELEVATION INTO MULTIPLE ROWS FORMING DISTINCT STRIPPERS ~1620

PLACE THE STRIPPERS (FORMED BY THE DICING) INTO THE MACHINED SLOTS IN THE BACKING BLOCK ~1630

BOND ONE OR MORE MATCHING LAYERS TO THE STRIPPERS ~1640

DICE THE MATCHING LAYERS IN ELEVATION ALONG A MULTI-ROW DIMENSION TO COMPLETELY CUT THROUGH THE CONDUCTIVE ELECTRODE ON THE FIRST MATCHING LAYER SURFACE ~1650

DICE THE PIEZOELECTRIC LAYER (THE LAYER WHICH BECAME THE STRIPPERS) IN AZIMUTH ALONG AN ELEVATION DIRECTION TO FORM MULTIPLE COLUMNS ~1660

FILL THE GAPS AND KERFS CREATED BY THE DICING ~1670

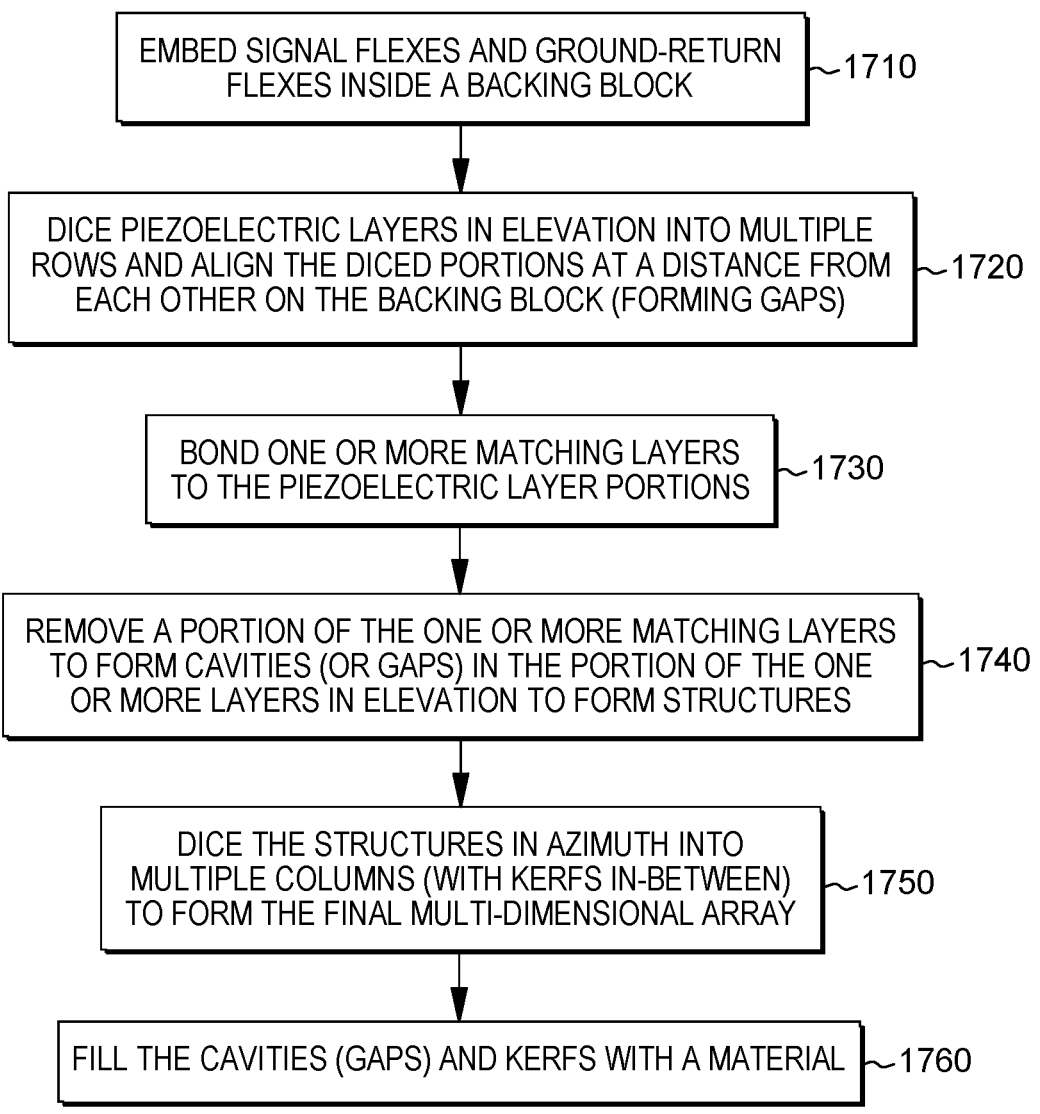

EMBED SIGNAL FLEXES AND GROUND-RETURN FLEXES INSIDE A BACKING BLOCK ~1710

DICE PIEZOELECTRIC LAYERS IN ELEVATION INTO MULTIPLE ROWS AND ALIGN THE DICED PORTIONS AT A DISTANCE FROM EACH OTHER ON THE BACKING BLOCK (FORMING GAPS) ~1720

BOND ONE OR MORE MATCHING LAYERS TO THE PIEZOELECTRIC LAYER PORTIONS ~1730

REMOVE A PORTION OF THE ONE OR MORE MATCHING LAYERS TO FORM CAVITIES (OR GAPS) IN THE PORTION OF THE ONE OR MORE LAYERS IN ELEVATION TO FORM STRUCTURES ~1740

DICE THE STRUCTURES IN AZIMUTH INTO MULTIPLE COLUMNS (WITH KERFS IN-BETWEEN) TO FORM THE FINAL MULTI-DIMENSIONAL ARRAY ~1750

FILL THE CAVITIES (GAPS) AND KERFS WITH A MATERIAL ~1760

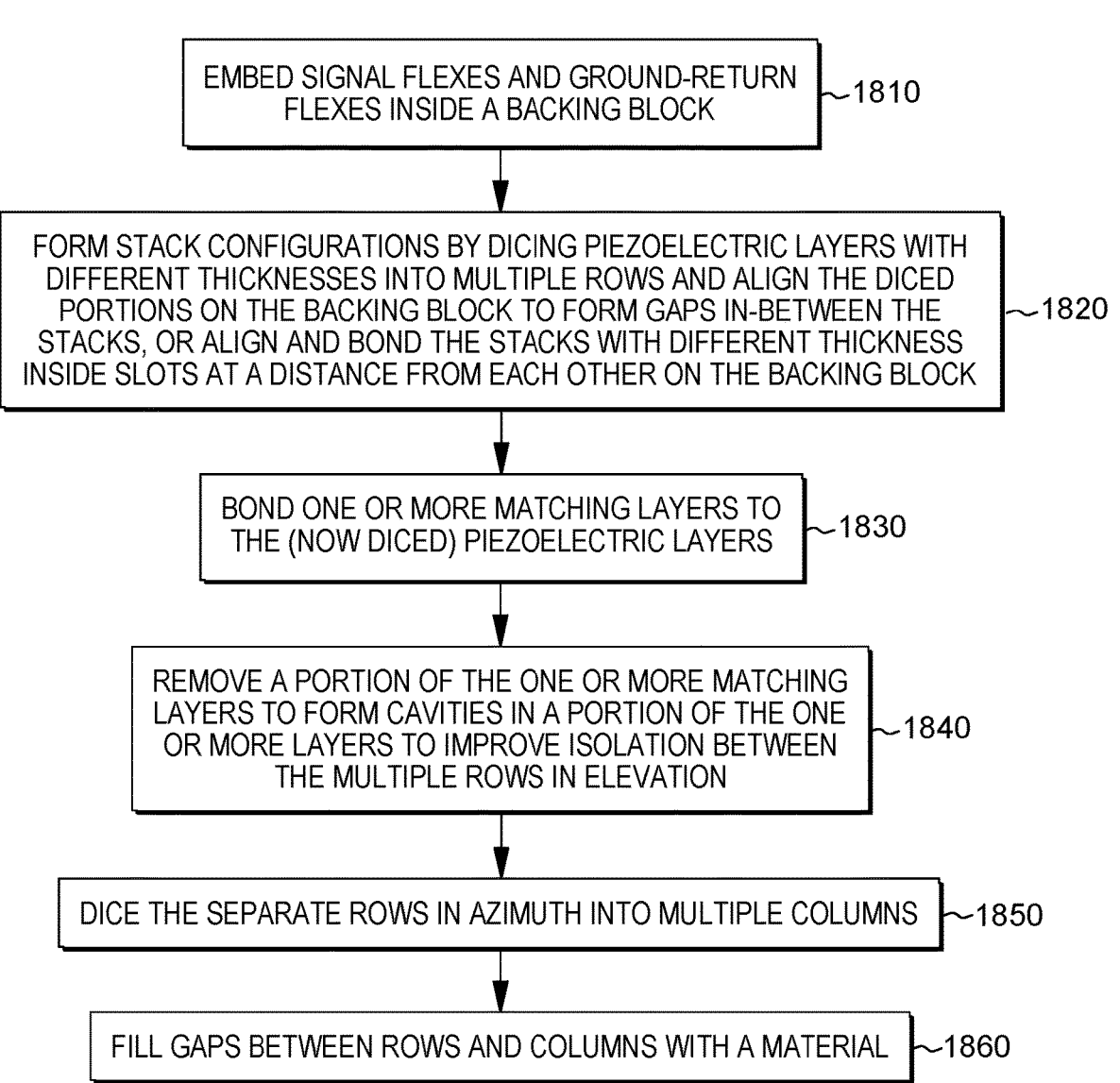

EMBED SIGNAL FLEXES AND GROUND-RETURN FLEXES INSIDE A BACKING BLOCK ~1810

FORM STACK CONFIGURATIONS BY DICING PIEZOELECTRIC LAYERS WITH DIFFERENT THICKNESSES INTO MULTIPLE ROWS AND ALIGN THE DICED PORTIONS ON THE BACKING BLOCK TO FORM GAPS IN-BETWEEN THE STACKS, OR ALIGN AND BOND THE STACKS WITH DIFFERENT THICKNESS INSIDE SLOTS AT A DISTANCE FROM EACH OTHER ON THE BACKING BLOCK ~1820

BOND ONE OR MORE MATCHING LAYERS TO THE (NOW DICED) PIEZOELECTRIC LAYERS ~1830

REMOVE A PORTION OF THE ONE OR MORE MATCHING LAYERS TO FORM CAVITIES IN A PORTION OF THE ONE OR MORE LAYERS TO IMPROVE ISOLATION BETWEEN THE MULTIPLE ROWS IN ELEVATION ~1840

DICE THE SEPARATE ROWS IN AZIMUTH INTO MULTIPLE COLUMNS ~1850

FILL GAPS BETWEEN ROWS AND COLUMNS WITH A MATERIAL ~1860

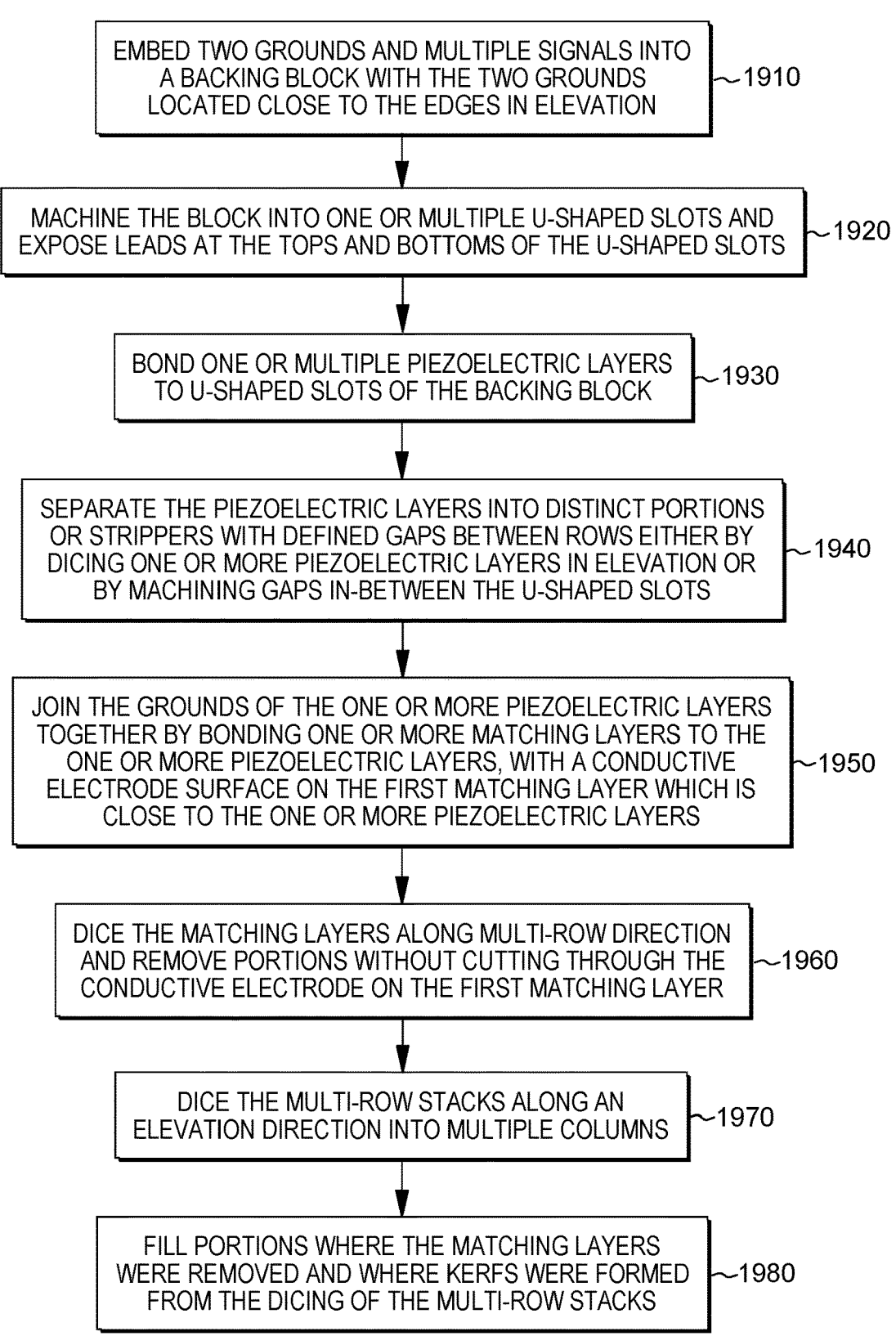

EMBED TWO GROUNDS AND MULTIPLE SIGNALS INTO A BACKING BLOCK WITH THE TWO GROUNDS LOCATED CLOSE TO THE EDGES IN ELEVATION ∼1910

MACHINE THE BLOCK INTO ONE OR MULTIPLE U-SHAPED SLOTS AND EXPOSE LEADS AT THE TOPS AND BOTTOMS OF THE U-SHAPED SLOTS ∼1920

BOND ONE OR MULTIPLE PIEZOELECTRIC LAYERS TO U-SHAPED SLOTS OF THE BACKING BLOCK ∼1930

SEPARATE THE PIEZOELECTRIC LAYERS INTO DISTINCT PORTIONS OR STRIPPERS WITH DEFINED GAPS BETWEEN ROWS EITHER BY DICING ONE OR MORE PIEZOELECTRIC LAYERS IN ELEVATION OR BY MACHINING GAPS IN-BETWEEN THE U-SHAPED SLOTS ∼1940

JOIN THE GROUNDS OF THE ONE OR MORE PIEZOELECTRIC LAYERS TOGETHER BY BONDING ONE OR MORE MATCHING LAYERS TO THE ONE OR MORE PIEZOELECTRIC LAYERS, WITH A CONDUCTIVE ELECTRODE SURFACE ON THE FIRST MATCHING LAYER WHICH IS CLOSE TO THE ONE OR MORE PIEZOELECTRIC LAYERS ∼1950

DICE THE MATCHING LAYERS ALONG MULTI-ROW DIRECTION AND REMOVE PORTIONS WITHOUT CUTTING THROUGH THE CONDUCTIVE ELECTRODE ON THE FIRST MATCHING LAYER ∼1960

DICE THE MULTI-ROW STACKS ALONG AN ELEVATION DIRECTION INTO MULTIPLE COLUMNS ∼1970

FILL PORTIONS WHERE THE MATCHING LAYERS WERE REMOVED AND WHERE KERFS WERE FORMED FROM THE DICING OF THE MULTI-ROW STACKS ∼1980

ARRAY ARCHITECTURE AND INTERCONNECTION FOR TRANSDUCERS

BACKGROUND

In conventional ultrasound diagnostic imaging systems, one-dimensional (1D) arrays are used as an interface to convert electrical signal into ultrasound waves and reconvert the received, reflected ultrasound from a tissue structure to an electrical signal. 1D arrays utilize a fixed acoustic lens, such as a convex RTV (room-temperature-vulcanizing silicone) lens, in the elevation direction to focus the ultrasound beam to improve image resolution or image slice thickness. However, the fixed elevation focus in 1D arrays brings challenges to meet the clinical requirements on both high resolution and deep penetration depth. Currently, the most popular ultrasound transducers in medical imaging are 1D arrays, which utilize a fixed aperture with an acoustic lens in the elevation to improve image resolution. Transducer elements can be arranged in a linear 1D row or chain (a so-called linear array) and can be controlled by an electronic control unit, separately or in groups, to achieve a directing effect. However, a fixed aperture provides limited flexibility to achieve a uniform and narrow beam pattern from the near field to the far field in elevation for clinical applications (e.g., high resolution and deep penetration depth). Although the elevational resolution can be improved by using controlled multi-row arrays (e.g., 1.25D or 1.5D) for elevation aperture adjustment, the cost of building multi-row arrays in production is high due to the complicated electrical interconnections among rows and columns. The complexity of these connections also opens possibilities for malfunctions and can affect the longevity of a device. Additionally, although the elevational resolution can be improved, current multi-row arrays introduce a limitation of all rows are typically being of the same center frequency.

SUMMARY

Shortcomings of the prior art can be overcome and benefits as described later in this disclosure can be achieved through the provision of a method for fabricating a transducer. Various examples of the method are described below, and the method, including and excluding the additional examples enumerated below, in any combination (provided these combination are not inconsistent), overcome these shortcomings. The method includes, for instance: embedding signal flexes and ground-return flexes inside a backing block. The method also includes forming stack configurations, where each stack configuration has a height in elevation and a width perpendicular to the height. The forming includes dicing a piezoelectric layer in an elevation of the piezoelectric layer into multiple rows, the dicing separating the piezoelectric layer into piezoelectric layer portions. The forming also includes defining a beam pattern for the transducer by aligning the piezoelectric layer portions on the backing block, the defining the beam pattern including aligning each piezoelectric layer portion at a distance from another piezoelectric layer portion. The forming also includes based on the aligning, forming gaps in-between each piezoelectric layer portion and each adjacently aligned piezoelectric layer portion. The method further includes forming stacks by bonding one or more matching layers to the piezoelectric layer portions by utilizing a conductive surface of a first matching layer of the one or more matching layers. The method includes forming cavities in the one or more matching layers. The method includes dicing the stacks along an elevation direction into multiple elements. The method includes filling the cavities with a material.

Shortcomings of the existing transducers can be overcome and benefits as described later in this disclosure can be achieved through the provision of a transducer as described herein. Various examples of this transducer are described below, and the transducer, including and excluding the additional examples enumerated below, in any combination (provided these combination are not inconsistent), overcomes these shortcomings. The transducer can include: a lens, signal flexes and ground-return flexes inside a backing block, and stack configurations aligned on the backing block. The stack configurations each comprise a piezoelectric layer and one or more matching layers. A gap is formed in elevation in-between each piezoelectric layer and each adjacently aligned piezoelectric layer. Each stack configuration has a height in elevation, a width perpendicular to the height, and a stack-up thicknesses-configuration. The stack-up thicknesses-configuration is perpendicular to the height and perpendicular to the width. The one or more matching layers are coupled to the lens and bonded to each piezoelectric layer. A conductive surface of a matching layer of the one or more matching layers is coupled to a top surface of each piezoelectric layer. The one or more matching layers comprise one or more cavities. The cavities are filled with a material. Some examples include a de-matching layer on the backside of the piezoelectric layer.

Shortcomings of the existing transducers can be overcome and benefits as described later in this disclosure can be achieved through the provision of a transducer as described herein. Various examples of this transducer are described below, and the transducer, including and excluding the additional examples enumerated below, in any combination (provided these combination are not inconsistent), overcomes these shortcomings. The transducer can include: a lens, signal flexes and ground-return flexes inside a backing block, and stack configurations aligned on the backing block. Each stack configuration of the stack configurations is aligned on the backing block in a row of at least two outer rows and a center row. The center row generates a first frequency signal and the at least two outer rows generate a second frequency signal. A frequency of the first frequency signal is not equivalent to a frequency of the second frequency signal. The stack configurations each comprise: a piezoelectric layer and one or more matching layers coupled to the lens and bonded to each piezoelectric layer. A gap is formed in elevation in-between each piezoelectric layer and each adjacently aligned piezoelectric layer. A conductive surface of a matching layer of the one or more matching layers is coupled to a top surface of each piezoelectric layer. One or more matching layers comprise one or more cavities. The cavities are filled with a material. Some examples include a de-matching layer on the backside of the piezoelectric layer.

Additional features are realized through the devices and techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 5 depicts a workflow for fabricating a transducer in accordance with some aspects of some embodiments of the present invention;

FIG. 6 depicts a workflow for fabricating a transducer in accordance with some aspects of some embodiments of the present invention;

FIG. 15 depicts a workflow for fabricating a transducer in accordance with some aspects of some embodiments of the present invention;

FIG. 16 depicts a workflow for fabricating a transducer in accordance with some aspects of some embodiments of the present invention;

FIG. 17 depicts a workflow for fabricating a transducer in accordance with some aspects of some embodiments of the present invention; and FIG. 18 depicts a workflow for fabricating a transducer in accordance with some aspects of some embodiments of the present invention.

FIG. 19 depicts a workflow for fabricating a transducer in accordance with some aspects of some embodiments of the present invention.

DETAILED DESCRIPTION

Figure 1:
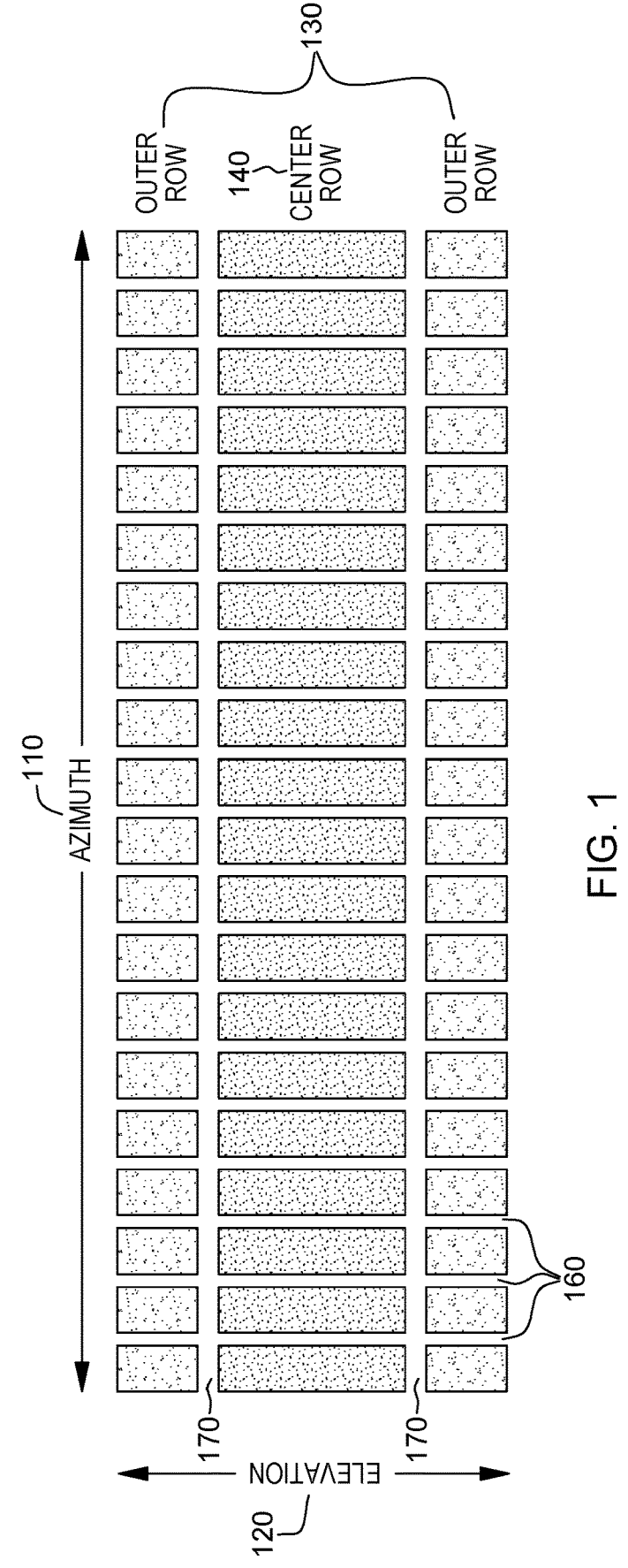
FIG. 1 depicts various aspects of a transducer in some embodiments of the present invention.

The accompanying figures, which are not drawn to scale for ease of understanding, in which like reference numerals may refer to identical or functionally similar elements throughout the separate views and which are incorporated in and form a part of the specification, further illustrate the present invention and, together with the detailed description of the invention, serve to explain the principles of the present invention. As understood by one of skill in the art, the accompanying figures are provided for ease of understanding and illustrate aspects of certain embodiments of the present invention. The invention is not limited to the embodiments depicted in the figures.

Term Examples

The terms "connect," "connected," "contact" "coupled" and/or the like are broadly defined herein to encompass a variety of divergent arrangements and assembly techniques. These arrangements and techniques include, but are not limited to (1) the direct joining of one component and another component with no intervening components therebetween (i.e., the components are in direct physical contact); and (2) the joining of one component and another component with one or more components therebetween, provided that the one component being "connected to" or "contacting" or "coupled to" the other component is somehow in operative communication (e.g., electrically, fluidly, physically, optically, etc.) with the other component (notwithstanding the presence of one or more additional components therebetween). It is to be understood that some components that are in direct physical contact with one another may or may not be in electrical contact and/or fluid contact with one another. Moreover, two components that are electrically connected, electrically coupled, optically connected, optically coupled, fluidly connected or fluidly coupled may or may not be in direct physical contact, and one or more other components may be positioned therebetween.

The terms "including" and "comprising", as used herein, mean the same thing.

The terms "substantially", "approximately", "about", "relatively," or other such similar terms that may be used throughout this disclosure, including the claims, are used to describe and account for small fluctuations, such as due to variations in processing, from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. If used herein, the terms "substantially", "approximately", "about", "relatively," or other such similar terms may also refer to no fluctuations.

As used herein, "electrically coupled" refers to a transfer of electrical energy between any combination of a power source, an electrode, a conductive surface, a droplet, a conductive trace, wire, waveguide, nanostructures, other circuit segment and the like. The terms electrically coupled may be utilized in connection with direct or indirect connections and may pass through various intermediaries, such as a fluid intermediary, an air gap and the like.

As used herein, "azimuth" is an angular measurement in a spherical coordinate system. When a vector from an observer to a point of interest is projected perpendicularly onto a reference plane, the angle between the projected vector and a reference vector on the reference plane is called the azimuth. In ultrasound imaging, which is a subject discussed herein, the term "azimuth" is also called lateral. When defining a coordinate system in relation to the ultrasound imaging plane, the terms axial or radial describe depth along the ultrasound beams, and the terms lateral or azimuth describe in-plane angle or distance (i.e., across the beam), while elevation describes an out of plane distance or angle.

As used herein, the terms "kerf" are adjustable gaps between diced portions of the acoustic surface that are filled in each example, with materials that vary (to maintain and adjust the gaps).

Different transducer schemes are discussed herein and referred to as 1D, 1.25D, 1.5D, 1.75D, and 2D arrays. The "D" in each case, stands for the word, "dimensional." As used herein, in a 1D transducer scheme, an elevation aperture is fixed, and it is focused at a fixed range. In a 1.25D transducer scheme, an elevation aperture is variable, but focusing remains static. In a 1.5D transducer scheme, the elevation aperture, shading, and focusing are dynamically variable, but symmetric about the centerline of the array. Conversely, a 1.75D array is a 1.5D array without the symmetry constraint. Hence, elements are large (e.g., several wavelengths) in elevation, so very little steering is possible. In a 2D transducer array, elevation geometry and performance are comparable to azimuth, with full electronic apodization, focusing, and steering.

The term "ROC" refers to the radius of curvature and is utilized in the context of acoustic design herein. In medical ultrasound arrays, a ROC lens is generally a cylindrical focus lens. The lenses referred to herein as ROC lenses are single radius focus lenses and the lenses referred to herein as multi-ROC lenses are multiple radii focus lenses. An ROC for a convex acoustic lens is a product of the geometric focal length and one less than a result of the speed of sound of the medium divided by the speed of sound of the lens material. Acoustic lenses, which are utilized herein, were designed based on the paraxial theory or Fresnel approximation in geometrical optics, assuming a plane wave front emitted in a direction normal to the transducer surface.

As used herein, the term "PZT" refers to lead zirconate titanate or lead zirconium titanate, which is a ceramic perovskite material that shows a piezoelectric effect, i.e., the compound changes shape when an electric field is applied. In this context, it is utilized in ultrasonic transducers. PZT ceramic is the most commonly used piezoelectric ceramic because it has a greater sensitivity and higher operating temperature than other piezoelectric ceramics. As used herein, the term "SX", which is used in conjunction with "PZT" as "PZT/SX" refer to a single crystal lead zirconate titanate or lead zirconium titanate layer.

As used herein, the term "DML" refers to de-matching layer, which is a material with an acoustic impedance typically higher than the piezoelectric material used in the transducer, in some cases lower acoustic impedance materials can also be used as DML. Tungsten carbide (WC) or tungsten (W) is most commonly used as DML material because it is electrically conductive and has an acoustic impedance around 100 MRayls as compared to that of piezoelectric materials (PZT or SX) ranging from 20 MRayls to 35 MRayls.

As used herein, the terms "signals flexes" and "ground-return flexes" refer to signal and ground-return elements in flexible electronics, also known as flex circuits, which are circuits that conformed to desired shapes (e.g., flex during use). Flex circuits are utilized as connectors in various applications were flexibility, space savings, and/or production constraints limit the serviceability of rigid circuit boards or hand wiring. Many flexible circuits are passive wiring structures that are used to interconnect electronic component As used herein, the term "stripper" refers to a distinct portion of an element. For example, certain examples herein include dicing a piezoelectric layer into strippers.

As used herein, the term "stack configuration" refers to a pile of objects, referred to herein as "stacks" that, in the context of the examples herein, includes pieces of a piezoelectric layer, diced in elevation into multiple rows, as well as the matching layers and the de-matching layer in some cases. As described herein, each stack configuration is described relative to three dimensions: a height in elevation, a width perpendicular to the height, and a stack-up thicknesses-configuration perpendicular to the height and perpendicular to the width.

As used herein, the term "beam pattern" (which can also be referred to as an acoustic radiation pattern), is the relative sensitivity of a transducer as a function of spatial angle. This pattern is determined by factors such as the frequency of operation and the size, shape and acoustic phase characteristics of the vibrating surface. The beam patterns of transducers are reciprocal, which means that the beam will be the same whether the transducer is used as a transmitter or as a receiver. Generally, transducers can be designed to radiate sound in many different types of patterns, from omnidirectional to very narrow beams.

Embodiments of the present invention include multiple row or multi-row transducers and a method for building these multi-row transducers. Some embodiments of the present invention combine multi-frequency features and multi-row (multiple dimensional) characteristics to advance image quality, including both resolution and penetration, to service multiple clinical functional needs and enable portability by utilizing only one transducer.

Examples of the invention include high performance transducers that significantly broaden frequency ranges and enhance elevational beam patterns. The broader ranges and elevational beam patterns in embodiments of the present invention can be achieved utilizing only one transducer. Both the method and the transducers themselves meet various clinical needs. As described in greater detail herein, examples of the present invention include, but are not limited to, a method of fabricating multi-dimensional (e.g., 1.25D, 1.5D, 1.75D & 2D) and multi-frequency arrays with a low design and manufacturing cost and the fabricated transducers themselves. Examples of the present invention provide advantages over existing ultrasound applications including, but not limited to: 1) expanding current array architecture concepts and solderless interconnection fabrication techniques to multi-dimensional and multi-frequency array configurations (e.g., broadening frequency ranges) to improve the elevation beam profile and significantly broaden the transducer frequency range; and/or 2) using a single transducer to improve imaging resolution, penetration and overall image quality by enhancing elevational beam patterns in both near and far fields. As will be described herein, the disclosed fabrication methods as well as the resultant transducers can vary in design in accordance with the clinical applications for which they are intended but will include the advantages discussed above. For example: 1) gap and row width values can be adjusted to fit different applications; and/or 2) multi-ROC focus options of a lens can be leveraged for further modifying and conditioning the elevational beam profile characteristics (e.g., elevational beam width), from the near-field, through the transition zone, and all the way to the far-field.

Certain advantages of examples herein are achieved based on flexibility regarding the design. For example, examples described herein can be utilized not only in 1.25D arrays, but also in 1.5D, 1.75D and 2D arrays. As described in greater detail herein, these different arrays can include center-row and outer-rows comprising different stack configurations, different materials, and/or different thicknesses for generating different frequency signals. In some examples herein, the arrays include a combination of gap size and row width adjustments to provide an improved elevational beam pattern. In some examples, the gaps between the rows in the elevation can be as wide as up to several wavelengths, providing greater manufacturing flexibilities. The adjustable gaps can be filled with backing or other materials. The transducers described herein can include various numbers of matching layers (e.g., the center-row and outer-rows can utilize different numbers of matching layers) and can include or exclude electrically conductive de-matching layers (DMLs) (e.g., the center-row and the outer-rows can utilize different configurations). In ultrasound applications, matching layers provide an acoustic impedance gradient for acoustic energy from the transducer to smoothly penetrate body tissue and for reflected acoustic waves (e.g., a returning echo) to smoothly return to the transducer for detection. Matching layers can be located between acoustic elements (e.g., a piezoelectric layer) and a lens (e.g., a single radius focus lens and/or a multiple radii focus lens). Matching layers can include materials that are conducive to achieve better energy transfer (e.g., such as epoxy, polyurethane, polystyrene, graphite, composite of tungsten power mixed with epoxy, etc.). For example, these materials can be selected and constructed together to achieve a better energy transfer than the individual materials can achieve, individually. In general, ultrasound probes include at least one matching layer but some include two or three matching layers. Meanwhile, electrically conductive DMLs (e.g., tungsten carbide (WC), etc.) have an acoustic impedance greater than an acoustic impedance of the active acoustic layer, e.g., a piezoelectric layer, such as a piezoelectric ceramic (e.g., PZT/SX). The thickness of the DML can be varied to alter a bandwidth of the transducer. Examples herein can also include either a single-ROC or a multi-ROC focus lens.

Figure 12:
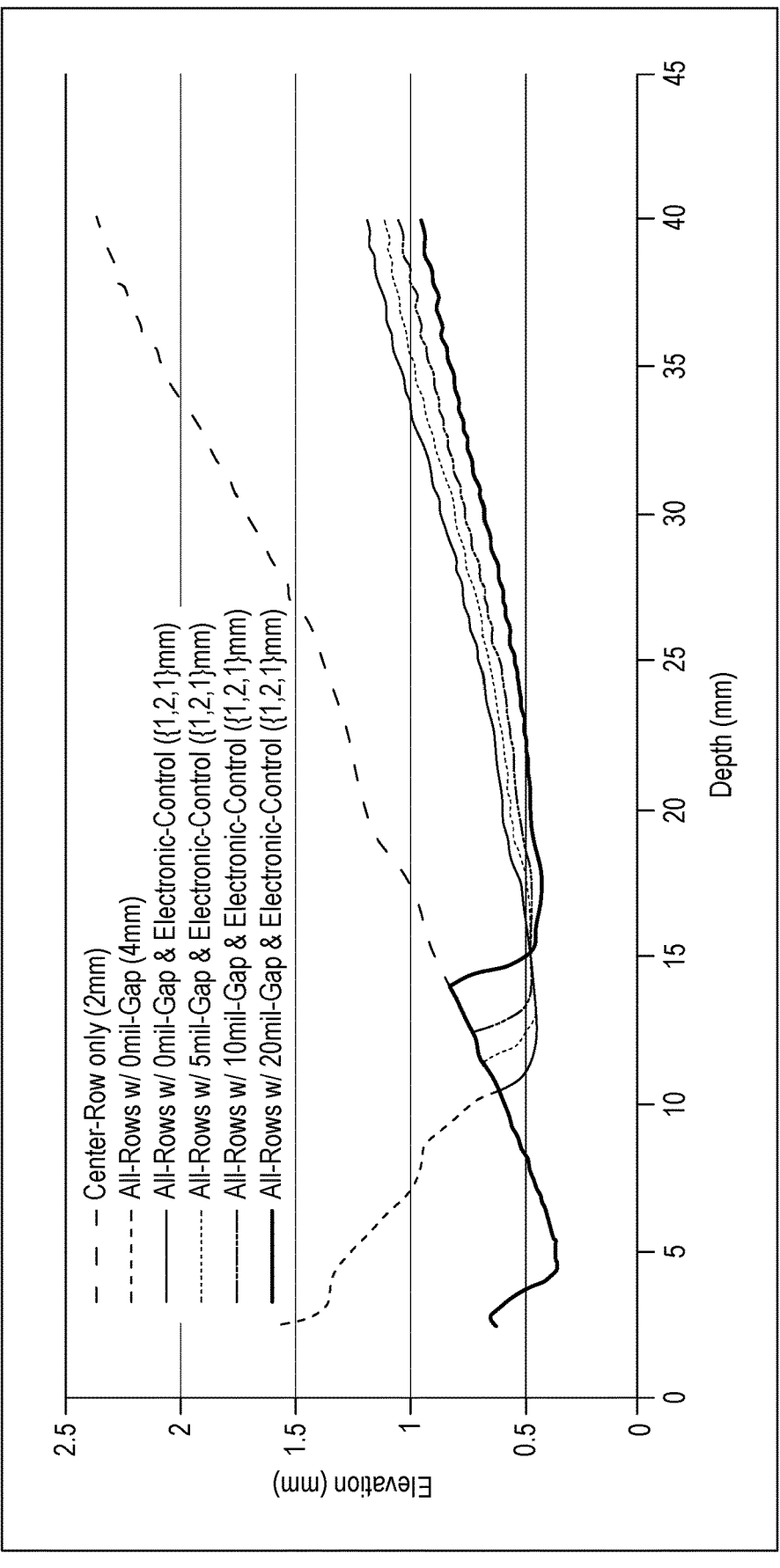
FIG. 12 is a plot that illustrates the impacts of different gap or kerf sizes in a transducer fabricated in accordance with various aspects of some embodiments of the present invention.
Figure 13:
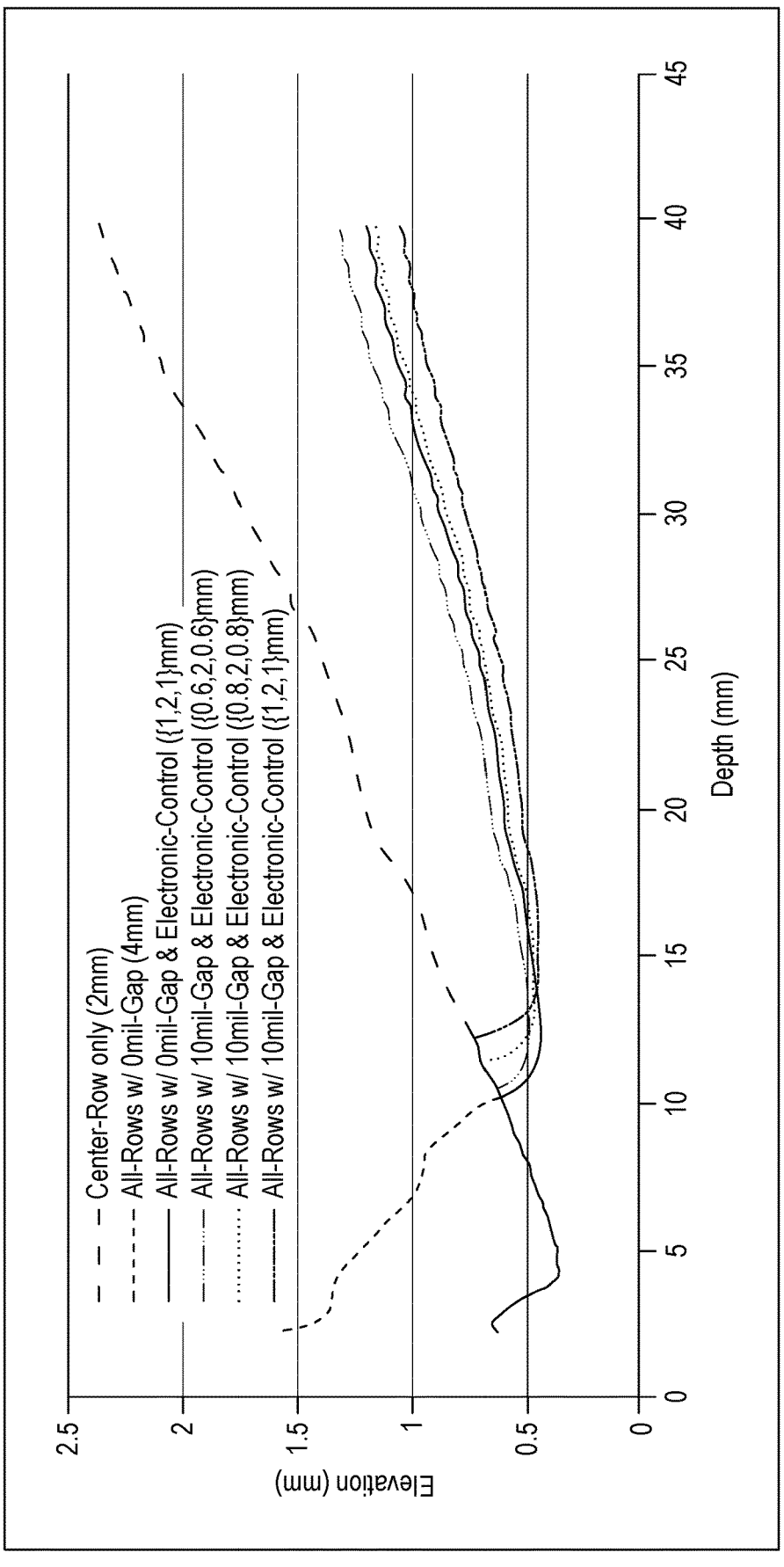
FIG. 13 is a plot that illustrates the impacts of different gap or kerf sizes and row-width in a transducer fabricated in accordance with various aspects of some embodiments of the present invention.
Figure 14:
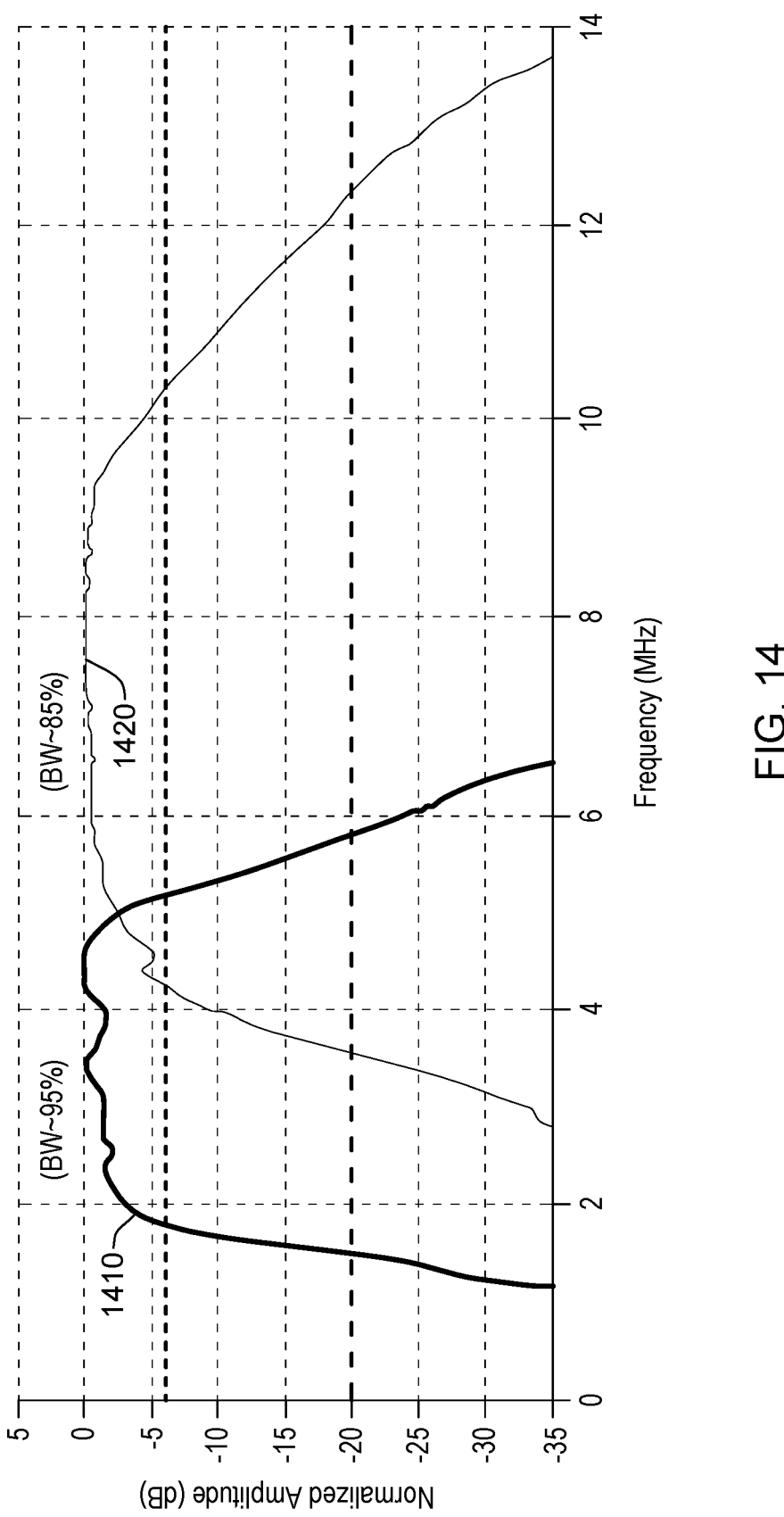
FIG. 14 is a frequency chart that illustrates various aspects of some embodiments of the present invention.

The figures herein, which are described individually, include figures which provide examples of transducers which can be utilized for ultrasound purposes and figures which illustrate examples of workflows, which describe aspects of fabricating these transducers. In some examples, certain aspects of the processes described in the workflows can be performed, at least in part, by a combination of one or more of the following implements: a tooling device, a composite plate, a tooling surface, a vacuum pump, a guiding device (e.g., a guiding ring or annulus), a CNC (Computer Numerical Control) machine, a clean area, a work station for micro precision transducer assembly, a fume hood station, and/or a calibrated oven. The workflows described here can incorporate on or more of enhanced surface area adhesion, passivation and cleaning of harsh surfaces, and/or plasma etching. FIGS. 1-14 illustrate various aspects of a method of fabricating multi-dimensional as well as multi-frequency arrays for transducers and the resulting transducers. FIGS. 1-4 and 7-11 illustrate various transducers fabricated according to various aspects of the methods disclosed herein. Meanwhile, FIGS. 5 and 6 describe workflows of the methods utilized to fabricate the transducers depicted in FIGS. 1-4 and 7-11. FIGS. 12-14 demonstrate benefits associated with the functionality of certain of the transducers disclosed herein. FIGS. 15-18 also illustrate examples of various workflows for fabricating transducers according to various aspects of the methods disclosed herein.

FIG. 1 illustrates a top view of a multi-row/multi-frequency transducer array 100. An azimuth 110 and an elevation 120 are depicted. Although there are three rows in this example, this is not provided as a limitation, just for illustrative purposes. Thus, transducers of a given frequency populate the outer rows 130 of the array 100, while transducers of a different frequency populate a center row 140 of the array 100. Elements of the array of FIG. 1 are referenced throughout to illustrate various elements of examples disclosed herein.

Figure 2:
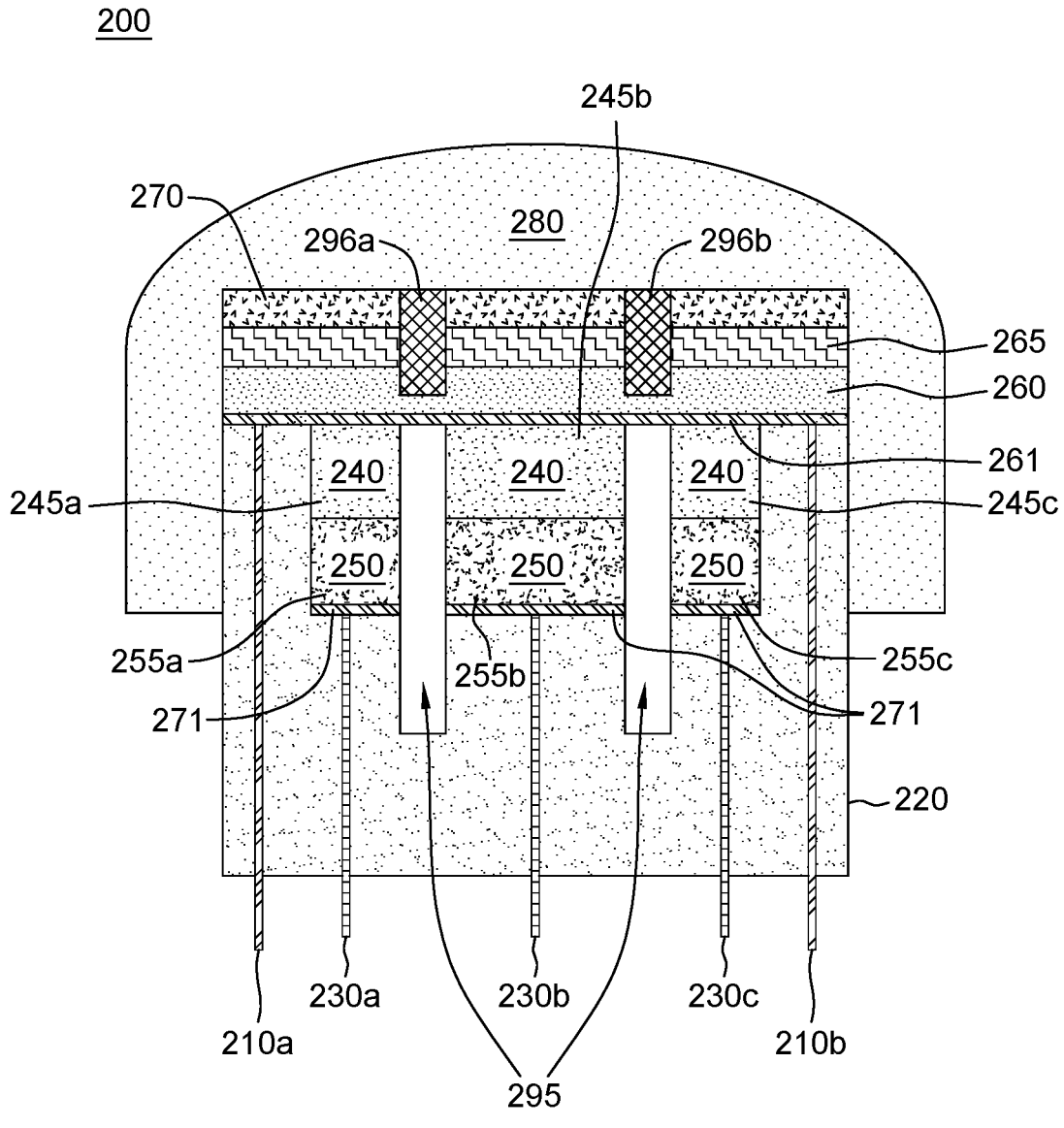
FIG. 2 depicts an elevation cross-section view of various aspects of a transducer in some embodiments of the present invention.
Figure 3:
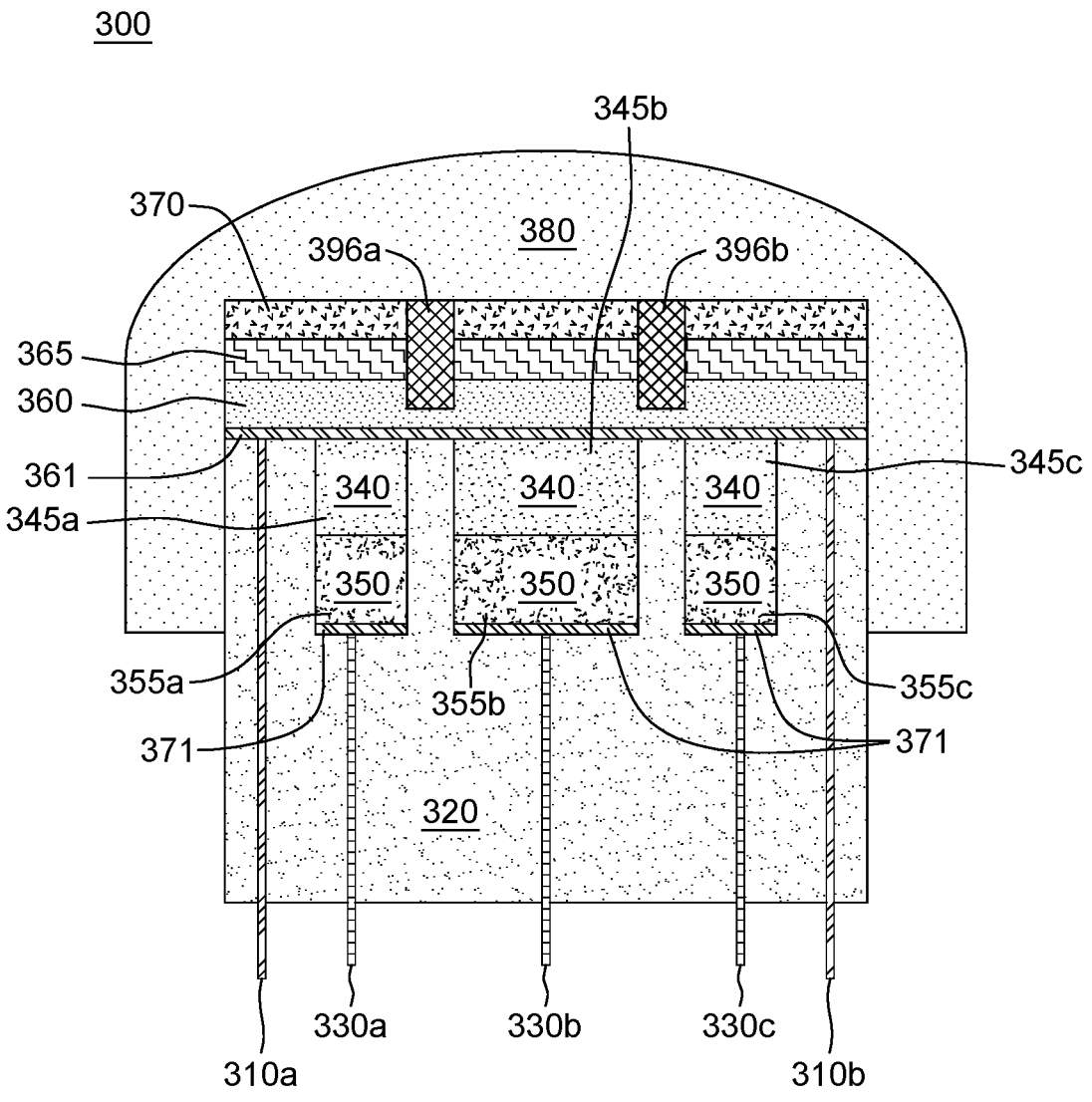
FIG. 3 depicts an elevation cross-section view of various aspects of a transducer in some embodiments of the present invention.
Figure 4:
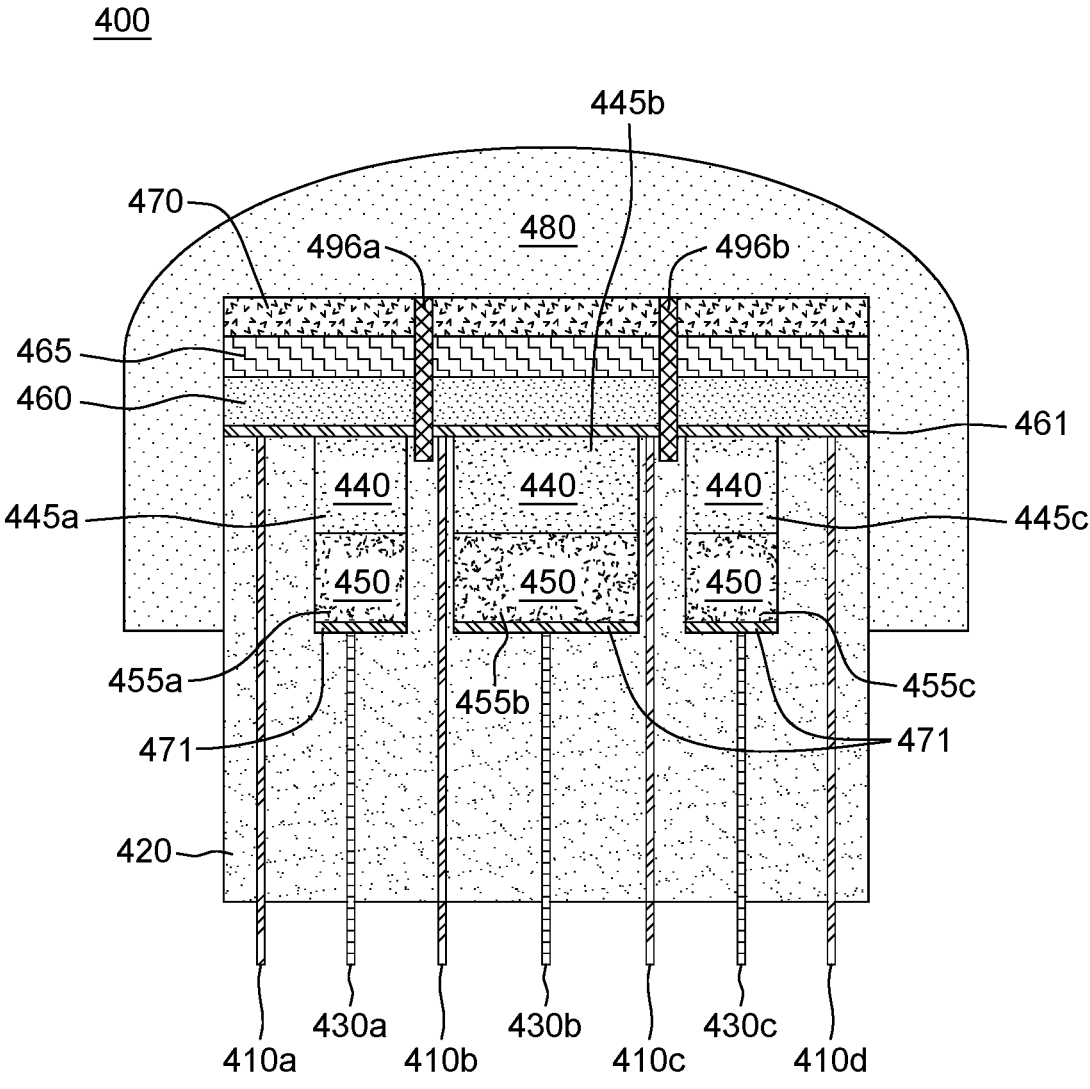
FIG. 4 depicts an elevation cross-section view of various aspects of a transducer in some embodiments of the present invention.

As discussed above, examples herein include transducer array architectures that include multi-dimensional configurations where the center row (e.g., FIG. 1, 140) and the outer rows (e.g., FIG. 1, 130), have a common stack. FIGS. 2-4 illustrate such examples where, in each transducer 200, 300, 400, the elevational views of the array architecture and interconnection scheme for the multi-dimensional configuration include this aspect. In these examples, an electrical signal connecting each row is embedded inside a backing block. Ground wires are also embedded inside backing strippers. Thus, as described in greater detail below, grounds from these multiple rows are connected through a conductive matching layer or a matching layer with a conductive surface, or an electrode. The matching layer includes an electrode on an inside (acoustic) surface (facing the piezoelectric material). Despite certain differences that are discussed herein, the multi-row transducers 200, 300, 400, of FIGS. 2-4 have certain commonalities. In each example, the configuration illustrated can be utilized in arrays of various dimensions, including in 1.25D, 1.5D, 1.75D, and in 2D arrays. There are adjustable gaps (also referred to as kerfs) between diced portions of the acoustic surface that are filled in each example with materials that vary. The beam patterns of the transducers 200, 300, 400 can be adjusted by varying one or more of gap size and row width. Despite each example depicting three matching layers, any number of matching layers can be utilized. Additionally, or alternatively, the electrically conductive DML can be optional. Finally, these examples can include different lenses, including but not limited to single focus ROC and multiple focus ROC lenses (also referred to as a single radius focus lens and a multiple radii focus lens, respectively).

FIG. 2 illustrates an elevation cross-section view of a multi-row transducer 200. The transducer 200 is an example of a 1.25D transducer and is assembled in accordance with the method described herein. A 1.25D transducer array is depicted herein as a non-limiting example, as various embodiments of the present invention can also include 1.5D, 1.75D, and 2.0D transducer arrays. However, the 1.25D example is provided for illustrative purposes. The transducer 200 includes a backing block 220, depicted here as being U-shaped. Two grounds 210a and 210b are embedded in the shoulder stripper portions of the machined U-shaped backing block 220. In some embodiments of the present invention, electrode sputtering is performed on the top surfaces. Electrical signals 230a-230c embedded at the bottom of the backing block 220, define positions for multi-row connections. Gaps 295 are created by dicing through the piezoelectric layer 240 and the DML 250 into the backing block 220. The electrically conductive DML 255a-255c electrically connects the backside of piezoelectric layers 245a-245c to the signal 230a-230c using solderless bonding connection. The piezoelectric layer 240, in elevation (e.g., FIG. 1, 110) was diced (as will be discussed in workflows that follow, including but limited to the workflow 500 of FIG. 1) into multiple rows 245a-245c. The gaps 295 are filled with material (e.g., air, micro-balloons, and/or high acoustic attenuated material, room-temperature-vulcanizing silicone, backing material, and/or a material mixed with micro-balloons).

This multi-row transducer 200 also includes three matching layers 260, 265, 270; the first matching layer 260 includes a conductive surface that includes an electrode 261. In some examples, the electrode 261 is electrically connected to the two grounds 210a and 210b using solderless bonding connection. In some examples, gaps 296a and 296b where the matching layers are removed by dicing aligning with dicing kerf 295 are filled with material (e.g., air, micro-balloon, lens material). Gaps 296a and 296b are illustrated in FIG. 1 as gaps 170. Gaps 296a and 296b where the dicing depth doesn't cut through the first matching layer 260 includes the conductive surface that includes an electrode 261. The transducer 200 also includes a piezoelectric layer (e.g., PZT/SX) 240 below the conductive surface that includes the electrode 261. The front electrodes of multiple row piezoelectric portions 240 are connected to each other with embedded ground-returns 210 through a conductive surface 261 of the first matching layer 260. The matching layers 260, 265, 270 are located between the piezoelectric layer 240 (e.g., the acoustic layer) and a lens 280. The lens 280 depicted in FIG. 2 is a single ROC focus lens, but other examples can include a multi-ROC focus lens.

In some examples, a piezoelectric layer 240, DML 250 and matching layers 260, 265, 270 are further diced together into backing block 220 in azimuth (i.e., along an elevation direction), into multiple columns, separating the piezoelectric material further into distinct portions or elements, to form a multi-dimensional array (e.g., multiple columns, where kerf 160, FIG. 1, separates the piezoelectric material into distinct portions or strippers). Referring to FIG. 1, the kerfs 160 or the azimuth gaps created, by this dicing are visible in FIG. 1, because FIG. 1 illustrates a top view of a multi-dimensional array of embodiments of the present invention. Meanwhile, the elevation gaps (gaps 170), also created by dicing, are illustrated in both FIG. 1 and FIG. 2 because this aspect is visible both from a top view (FIG. 1) and in an elevation cross-section view (FIG. 2). Referring to both FIG. 1 and FIG. 2, kerf 160, where the matching layers, a piezoelectric layer 240, DML 250 and backing block 220 are removed by this dicing and are filled with material (e.g., air, micro-balloons, lens material). In this example, a DML 250 is coupled to this acoustic layer, the piezoelectric layer 240. This piezoelectric layer 240 and DML 250, in elevation (e.g., FIG. 1, 110) were diced (as will be discussed in workflows that follow, including but limited to the workflow 500 of FIG. 1) into multiple rows 245a-245c and 255a-255c. The DML 250 also includes an electrode 271.

Like the transducer 200 of FIG. 2, FIG. 3 also depicts a non-limiting example of an elevation cross-section view of a 1.25D transducer 300, that is assembled in accordance with the method described herein. The transducer 300 of FIG. 3 also includes a backing block 320 (e.g., a triple U-shaped block), but unlike in FIG. 2, the backing block 320 is machined into three U-shaped trough block sections. Grounds 310a and 310b are embedded in the two outermost machined backing shoulder strippers, respectively. Electrical signals 330a-330c at the bottom of the backing block 320, define positions for multi-row connections. Like the transducer 200 of FIG. 2, the multi-row transducer 300 of FIG. 3 also includes three matching layers 360, 365, 370. The first matching layer 360 includes a conductive surface that includes an electrode 361. But unlike in FIG. 2, where a DML 250 and the piezoelectric layer 240 of the transducer 200 are diced and the gaps 295 that are formed after bonding the DML 250 and the piezoelectric layer 240 with embedded electrodes 230, in FIG. 3, the electrically conductive DML 350 and the piezoelectric layer 340 are diced into 355a-355c and 340a-340c, respectively, and the gaps are machined out from the backing block 320 into U-shaped trough block sections. Then, the DML 350 and the piezoelectric layer 340 are bonded. The electrically conductive DML 355a-355c electrically connects the backside of piezoelectric layers 345a-345c to the signal 330a-330c using solderless bonding connection. Each DML 355a-355c includes an electrode 371. In this non-limiting example, three U-shaped trough block sections are machined into the backing block 320. Bonded to the conductive surface (e.g., electrode 361) of the first matching layer 360 is a piezoelectric layer (e.g., PZT/SX) 340, which connects front electrodes of multiple row piezoelectric portions 340 with embedded ground-returns 310 through a conductive surface 361 of the first matching layer 360. The matching layers 360, 365, 370 are located between the piezoelectric layer 340 (the acoustic layer) and a lens 380 (e.g., a single ROC focus lens, a multi-ROC focus lens) and a DML 350 are coupled to the piezoelectric layer 340. Elevation gaps 396a and 396b (where the matching layers are removed) as well as the azimuth gaps (created by the subsequent azimuth-dicing after the elevation-dicing of the matching layers) are filled with material (e.g., air, micro-balloons, and/or high acoustic attenuated material, room-temperature-vulcanizing silicone, backing material, lens material, and/or a material mixed with micro-balloons).

FIG. 4 illustrates an example of an elevation cross-section view of a multi-row transducer 400 assembled in accordance with various aspects of the methods described herein. This example can be multi-dimensional (e.g., 1.25D, 1.5D, 1.75D, 2D). A backing block 420, depicted here, is machined into three U-shaped trough block sections with four embedded grounds 410a-410d. Four embedded grounds 410a-410d and three electrical signals 430a-430c at the bottom of the block 420, define positions for multi-row connections. The four grounds 410a-410d can be connected together outside of backing block 420. This multi-row transducer 400 also includes three matching layers 460, 465, 470 located between the piezoelectric layer 440 (the acoustic layer) and a lens 480. The first matching layer 460 includes a conductive surface that includes an electrode 461. As in FIG. 3, in the transducer 400 of FIG. 4, the piezoelectric layer (e.g., PZT/SX) 440 below the conductive surface and electrically conductive DML 450 are diced together into three portions before being placed into the machined U-shaped slots of the backing block. The electrically conductive DML 455a-455c, which includes an electrode 471, electrically connects the backside of piezoelectric layers 445a-445c to the signal 430a-430c. Unlike in FIGS. 2 and 3, the elevation dicing of the three matching layers (to create gaps 496a and 496b) is completely cutting through the conductive surface as shown in FIG. 4. Elevation gaps 496a and 496b (where the matching layers are removed) as well as the azimuth gaps (created by the subsequent azimuth-dicing after the elevation-dicing of the matching layers) are filled with material (e.g., air, micro-balloon, lens material).

FIGS. 5 and 6 illustrate workflows 500, 600, respectively, that describe the assembly of the multi-row transducers 200, 300, in FIGS. 2 and 3, and the multi-row transducer 400 of FIG. 4, respectively. As the workflow 500 is described, various aspects in the transducers 200, 300 of FIGS. 2 and 3 are referenced, for illustrative purposes. As the workflow

600 of FIG. 6 is described, various aspects in the transducer 400 of FIG. 4 are referenced, for illustrative purposes.

Referring to the workflow 500 of FIG. 5 and the multi-row transducer 200, 300, in this workflow 500, an individual and/or machine embeds two grounds 210*a* and 210*b*, 310*a* and 310*b* in a backing block 220, 320 (510). In some examples, a workflow includes embedding grounds and electrical signals into a casted backing block. One can also machine the block into one or multiple U-shaped slots and expose ground leads at the tops and electrical signals at the bottom of the backing block. As aforementioned the backing block can include one or more U-shaped slots. In the U-shaped block example, embed the two grounds 210*a* and 210*b*, 310*a* and 310*b* close to the elevational edges of the block and expose the leads at the tops of the U-shape of this backing block 220, 320. The signals 230*a*-230*c*, 330*a*-330*c* are therefore at the bottom of the U-shape and define positions for multi-row connections. An individual and/or machine performing the workflow bonds a piezoelectric layer (e.g., PZT/SX) 240 either directly to the backing block 220 (520) or through an electrically conductive DML 250. In some examples, one can bond the piezoelectric layer to the backing block in each aforementioned U-shaped slot. Examples of materials for bonding the piezoelectric layer 240 to the backing block 220 include, but are not limited to, epoxy resin, or epoxy resin with metallic particles (e.g., conductive epoxy). An individual and/or machine performing the dices the piezoelectric layer 240, in elevation (e.g., FIG. 1, 110) into multiple rows 245*a*-245*c* (530), to separate the piezoelectric layer 240 into distinct portions or strippers (e.g., multiple rows). For example, one can dice the piezoelectric layer in elevation into multiple rows, if more rows are utilized. The dicing forms gaps that can be filled with different materials in various embodiments of the present invention to maintain the gaps. In FIG. 2, the dicing forms gaps between the multiple rows 245*a*-245*c* (strippers). Some examples of the method include filling the gaps with air, a micro-balloon, and/or lens materials 295. In FIG. 3, unlike in FIG. 2, the piezoelectric layer 340 is not bonded to the backing block 320 before it is diced, but instead, after it is diced. In some examples, three U-shaped slots with defined gaps between the slots are machined into the backing material to accommodate the strippers 345*a*-345*c*. Thus, in FIG. 3, a machine and/or individual places the strippers 345*a*-345*c* in the slots. In some examples, the gaps between the slots are selected to be zeros, therefore there is only one U-shaped slot is machined into the backing material to accommodate the strippers 345*a*-345*c*. In other examples, additional kerf fill materials can be utilized provided such that the materials substantially fill kerfs between adjacent transducer elements.

Returning to FIG. 5, a machine and/or individual joins the piezoelectric layer 240, 340 to one or more matching layers 260, 360 (540). In some examples, a machine and/or individual places the diced portions (strippers, portions) 245*a*-245*c*, 345*a*-345*c* of the piezoelectric layer 240, 340 in machined slots in the backing block 220, 320, before being joined to the matching layers 260, 360. In the example in FIGS. 2 and 3, three matching layers are depicted, a first matching layer 260, 360 a second matching layer 265, 365 and a third matching layer 270, 370. However, this number of matching layers is merely provided as an example of a possible configuration in some embodiments of the present invention and not to suggest any limitations. As discussed above, ultrasound probes generally include at least one matching layer to achieve better energy transfer than in a probe without one or more matching layers. A machine and/or individual joins the matching layers to the piezoelectric layer 240, 340 (540) through electrical bonding, as the first matching layer 260, 360 is either conductive or has an electrode 261, 361 on its inside surface. Thus, the workflow 500 includes connecting the layers (in this example, the first matching layer 260, 360 the second matching layer 265, 365 and the third matching layer 270, 370) together. A machine and/or individual can connect a ground of each row through the conductive surface of the first matching layer 260, 360. Without cutting through the conductive electrode 261, 361 on the first matching layer 260, 360 surface, an individual and/or machine dices the matching layers (e.g., the first matching layer 260, 360 the second matching layer 265, 365 and the third matching layer 270, 370), along the multi-row direction (in elevation) and remove portions of the first matching layer 260 (550). Thus, after this elevation-dicing of the matching layers, the individual and/or machine further dices the transducer in azimuth (referred to earlier as azimuth-dicing) into multiple columns (550), separating the stack further into distinct portions or elements, to form the final multi-dimensional array. The individual and/or machine fills the elevation gaps 296*a*-*b*, 396*a*-*b* (where the matching layers are removed) as well as the azimuth gaps (created by the azimuth-dicing) with material (e.g., air, micro-balloons, lens material) (560).

Referring to the workflow 600 of FIG. 6, in this example, the method includes embedding (e.g., multiple) grounds and electrical signals into a backing block 420 (610). In some examples, one (individual and/or machine) embeds multiple grounds and electrical signals into a casted backing block. One machines the block into one or more U-shaped slots and exposes ground leads at the tops and electrical signals at the bottom of the backing block. In this example, embed four grounds and three electrical signals into the backing block 420. Machine the backing block 420 into three U-shaped sections such that the grounds form the four tops of the U-shape while three signals 430*a*-430*c* are at the bottom of the U-shape with defined positions for multi-row connections. Dice a piezoelectric layer 440 in elevation (e.g., FIG. 1, 120) into multiple rows 445*a*-445*c* (620), to separate the piezoelectric layer 440 into distinct portions or strippers (e.g., multiple rows). Place the strippers into machined slots in the backing block 420 (630).

The individual and/or machine bonds the one or more matching layers (e.g., first matching layer 460, second matching layer 465, third matching layer 470) and in this bonding, bond the first matching layer 460 with a conductive surface 461 to the piezoelectric layer 440 portions (strippers) 445*a*-445*c* (640). The individual and/or machine dices the one or more matching layers in elevation such that they are all cut through completely to improve acoustic and electrical isolations and thus angular responses for each row (650). In some examples, one can dice the one or more matching layers in elevation through completely while keeping the ground leads and the electrical signals in the U-shapes. After this elevation-dicing of the matching layers, the individual and/or machine dices the transducer in azimuth into multiple columns, separating the stack further into distinct portions or elements, to form the multi-dimensional array (660). The individual and/or machine fills the elevation gaps 496*a* and 496*b* (where the matching layers are removed (650)) as well as the azimuth kerfs (created by the subsequent azimuth-dicing (660)) with material (e.g., air, micro-balloons, lens material) (670).

Figure 7:
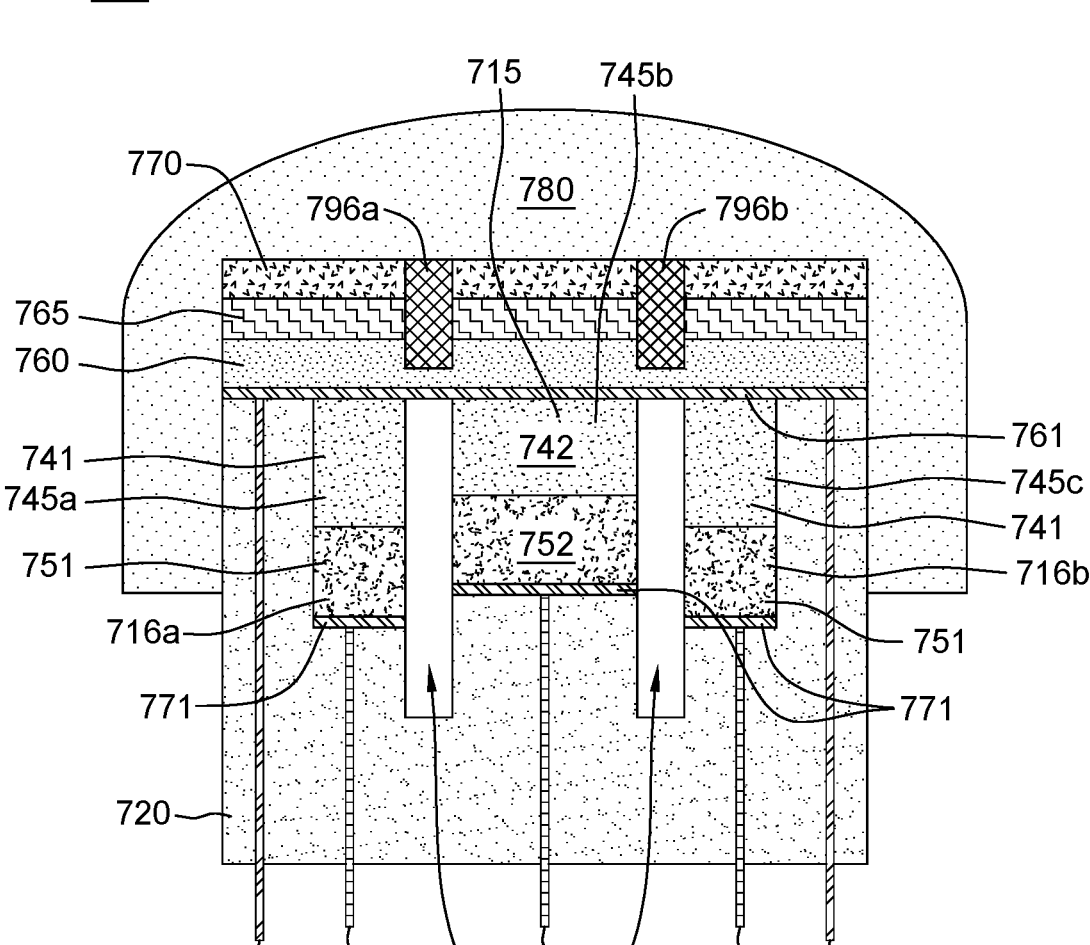
FIG. 7 depicts an elevation cross-section view of various aspects of a transducer in some embodiments of the present invention.
Figure 8:
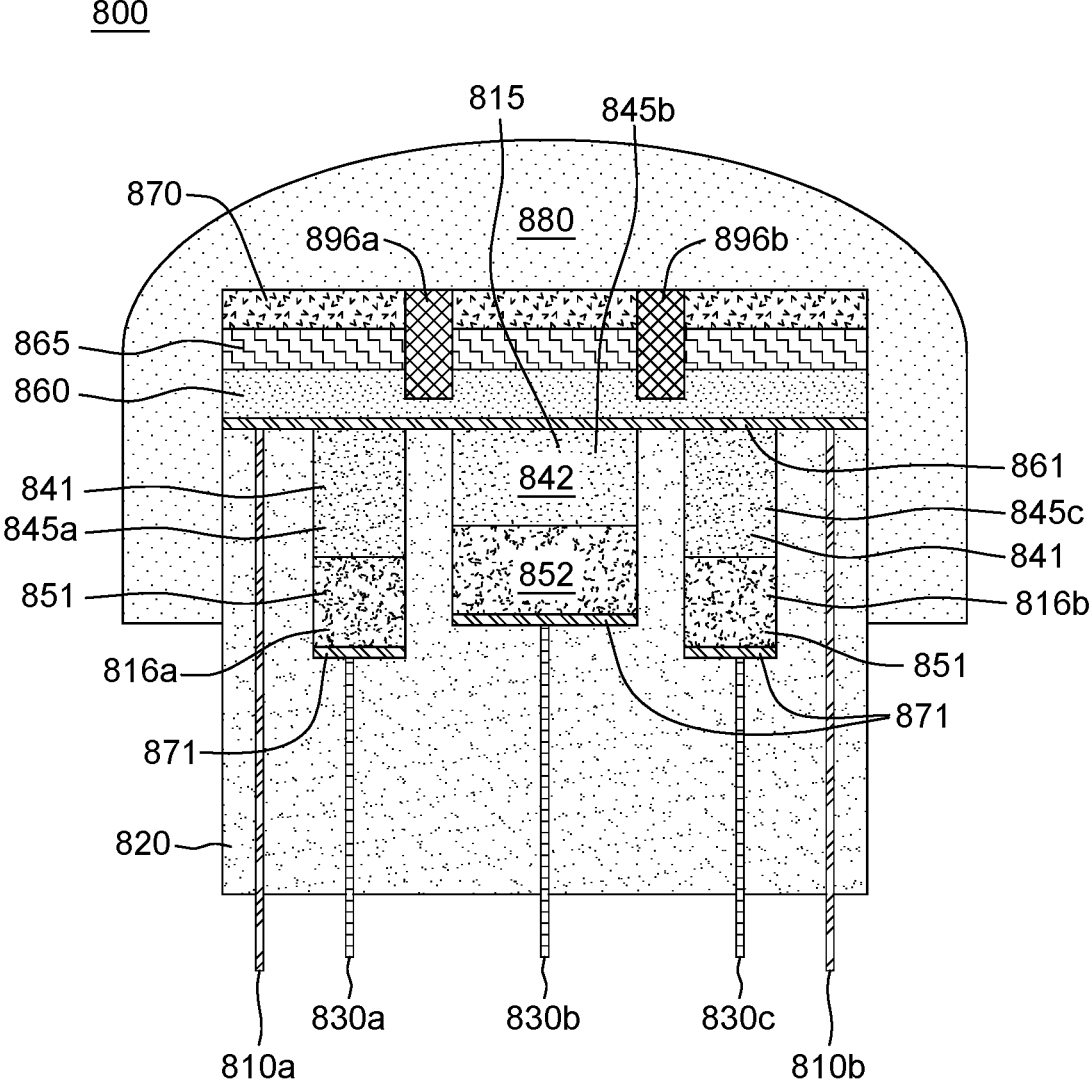
FIG. 8 depicts an elevation cross-section view of various aspects of a transducer in some embodiments of the present invention.
Figure 9:
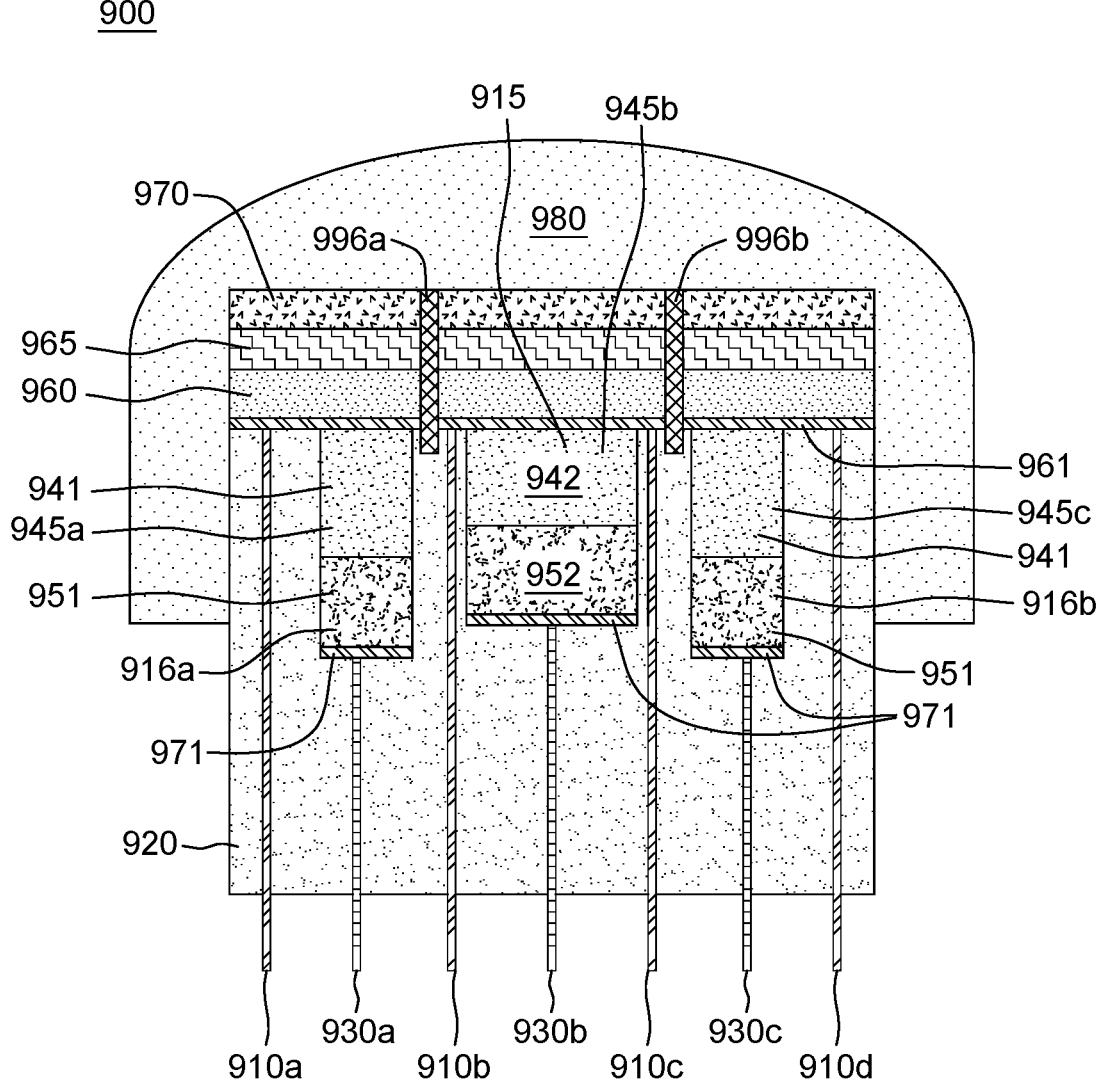
FIG. 9 depicts an elevation cross-section view of various aspects of a transducer in some embodiments of the present invention.

FIGS. 7-9 are examples of multi-row transducers 700, 800, 900, that are depicted in multi-frequency transducer configurations. The multiple dimensions combined with the multiple frequency aspect advances image quality (e.g., resolution and penetration) and also benefits ultra-portable applications by serving multiple clinical functions with a single transducer. In contrast, multiple conventional ultrasound probes can be needed to service multiple clinical functions, one conventional ultrasound probe for each clinical function, which can delay patient care when a conventional ultrasound probe suitable to a particular clinical procedure is not present with the clinician.

As with the earlier examples, the arrays of the multi-row transducers 700, 800, 900 can have various dimensions, 1.25D, 1.5D, 1.75D, and 2D. The frequency of the signals varies in these examples because, as will be depicted and described in more detail, the center-row and outer-rows can have different stack configurations, materials, and/or thicknesses. Specifically, in these examples, the outer rows (e.g., FIG. 1, 130) have slightly thicker stacks for generating lower frequency signals than thinner stacks would generate. As with the examples in FIGS. 2-4, the multi-row transducers 700, 800, 900 of FIGS. 7-9 include adjustable gaps filled with backing or other materials. A combination of gap size and row width adjustment provide a variety of beam patterns. The number of matching layers can vary in these examples and the center (e.g., FIG. 1, 140) and outer rows (e.g., FIG. 1, 130) can have different numbers of matching layers. Although DMLs are optional, in these examples, whether a DML is part of the configuration can vary between the center (e.g., FIG. 1, 140) and outer rows (e.g., FIG. 1, 130). Because the center and outer rows of the transducers 700, 800, 900 of FIGS. 7-9 generate different frequencies, the configurations of these portions can vary, as opposed to the transducers 200-400 in FIGS. 2-4 where there was a consistent frequency and hence, a consistent configuration between the outer and center rows.

As aforementioned, FIGS. 7-9, illustrate examples of transducer architectures 700, 800, 900. These figures provide elevation cross-section views of the array architecture and interconnection schemes for these multi-dimensional and multi-frequency transducer configurations, in each example, the center rows 715, 815, 915 and the outer rows 716a and 716b, 816a and 816b, 916a and 916b have different stacks of piezoelectric (acoustic) layers 741, 742, 841, 842, 941, 942 and optionally, one or more matching layers and/or with or without de-matching layer 751, 752, 851, 852, 951, 952. The assembly processes for these configurations include certain aspects of the workflows 500 and 600 of FIGS. 5 and 6, respectively.

Referring to FIG. 7, a multi-row and multi-frequency transducer 700, includes a backing block 720, depicted here as U-shaped, into which two grounds 710a and 710b are embedded and machined to expose leads on the top. Electrical signals 730a-730c at the bottom of the block 720, define positions for multi-row connections. In this example, the center row 715 and the outer rows 716 are configured differently. In some examples, the backing under DML 751 and 752 are machined with different heights. In the depicted example, the piezoelectric material and DML material together in the center 742, 752 have different heights than the outside piezoelectric material and DML 741, 751. However, the total height of the combination of the layers and the machined backing height is the same. Thus, unlike in FIGS. 2-4, the stacks may not be formed by dicing a piezoelectric layer. Alternatively, the outer rows 716a and 716b can include a portion of a single, diced piezoelectric layer 741 (piezoelectric layer 745a), while the center row 715 (piezoelectric layer 745b) could utilize a different piezoelectric layer 742 (piezoelectric layer 745c). The thickness and presence or absence of an electrically conductive DML can also vary between the center row 715 and the outer rows 716a and 716b. Thus, an outer row DML 751 and inner row DML 752 are indicated separately in FIG. 7. Each DML 751, 752 is electrically conductive and includes an electrode 771. The transducer 700 includes three matching layers 760, 765, 770, and the first matching layer 760 includes a conductive surface that includes an electrode 761. The matching layers 760, 765, 770 are located between the piezoelectric layers 741, 742 (the acoustic layer) and a lens 780. Gaps 796a and 796b are where the matching layers are removed are filled with material. The lens 780 depicted is a single ROC focus lens, but other examples can include a multi-ROC focus lens. Gaps 795 between each outer row 716a and 716b and the center row 715 are filled with a material which can include but is not limited to air or micro-balloons.

The transducer 800 of FIG. 8 is similar to the example in FIG. 7, but the gaps between each outer row 816a and 816b and the center row 815 are machined with the material of the backing block 820. Thus, an assembly process such as that of FIG. 6 can be utilized where the stacks or strippers are slotted into the backing block 820. FIG. 8 is a non-limiting example of a 1.25D transducer 800. The transducer 800 includes a backing block 820 (e.g., a triple U-shaped block), into which two grounds 810a and 810b are embedded and machined. Electrical signals 830a-830c at the bottom of the block 820, define positions for multi-row connections. This transducer 800 includes three matching layers 860, 865, 870, and the first matching layer 860 includes a conductive surface that includes an electrode 861. Bonded to the conductive surface (e.g., electrode 861) of the first matching layer 860 is a piezoelectric layer (e.g., PZT/SX) 840. The matching layers 860, 865, 870 are located between the piezoelectric layers 841 (845a, 845b), 842 (845b) (the acoustic layer) and a lens 880 (e.g., a single ROC focus lens, a multi-ROC focus lens). Gaps 896a and 896b are where the matching layers are removed are filled with material. DMLs 851, 852 can also be coupled to the other surface (e.g., the back side) of the piezoelectric layers 841, 842. Each DML 851, 852 is electrically conductive and includes an electrode 871.

The assembly process of FIG. 6 can also be utilized to assemble the transducer 900 of FIG. 9. This example can be a 1.25D, 1.5D, 1.75D, and/or a 2D array. A backing block 920, depicted here as U-shaped, is machined with four grounds 910a-910d embedded inside. Three electrical signals 930a-930c at the bottom of the block 920, define positions for multi-row connections. This multi-row transducer 900 also includes three matching layers 960, 965, 970 located between the piezoelectric layer 942 (945b), 941 (945a, 945b) (the acoustic layer) and a lens 980. The first matching layer 960 includes a conductive surface that includes an electrode 961. The transducer 900 also includes outer rows 916a and 916b and a center row 915 with different acoustic stacks of different thicknesses. Gaps 996a and 996b are where the matching layers are removed are filled with material. Each DML 951, 952 is electrically conductive and includes an electrode 971.

In FIGS. 7-9, the center row 715, 815, 915 and the outer rows 716a and 716b, 816a and 816b, 916a and 916b can generate slightly different frequency signals. For such cases where $\text{Frequency}_{-CenterRow} \sim \text{Frequency}_{-OuterRow}$, e.g. $\text{Frequency}_{-CenterRow}$ is between 80% to 120% of $\text{Frequency}_{-OuterRow}$, substantially the same matching layer structure can be maintained.

Figures 10, 11:
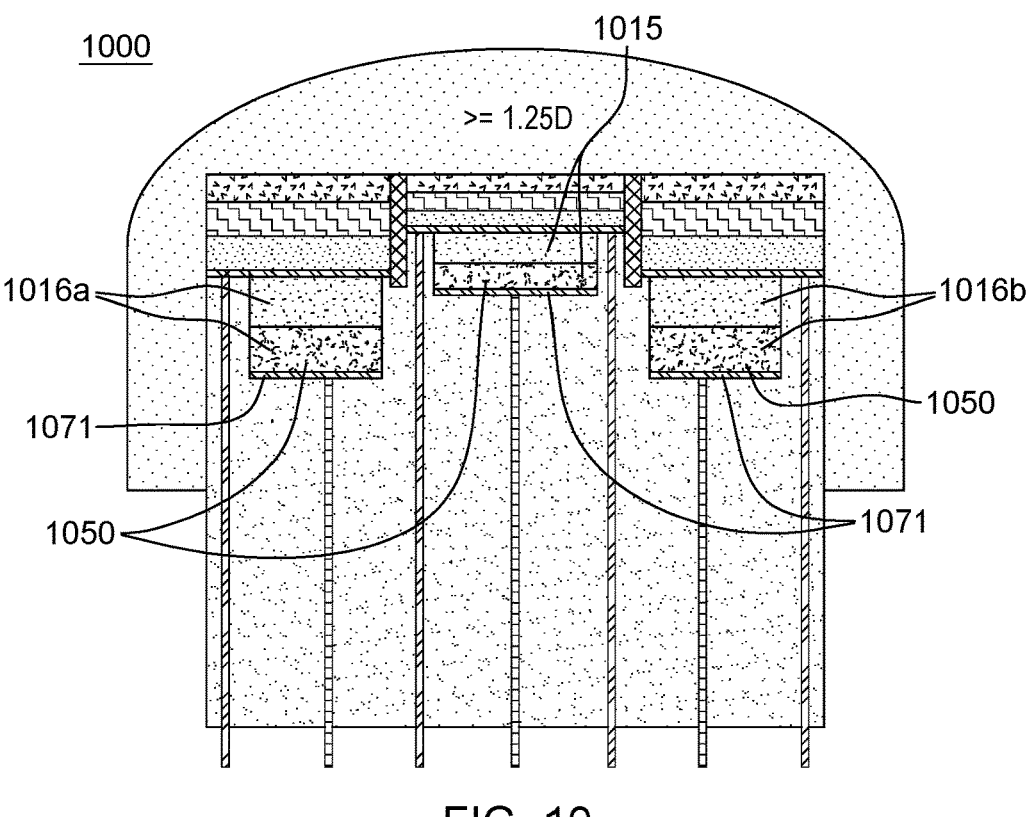
FIG. 10 depicts an elevation cross-section view of various aspects of a transducer in some embodiments of the present invention.
FIG. 11 depicts an elevation cross-section view of various aspects of a transducer in some embodiments of the present invention.

In some examples where the center row and the outer rows can generate very different frequency signals (e.g., Frequency_CenterRow~2*OuterRow), the thickness of the stack of matching layers (the center row vs. the outer rows) will need to be different in addition to the different piezoelectric layer thicknesses and DML thicknesses (if the configuration includes a DML) in order to achieve an improved acoustic performance (such as broader bandwidth and higher sensitivity). FIGS. 10 and 11 illustrate such different transducer configurations 1000, 1100 mentioned above. In FIGS. 10 and 11, the center rows 1015, 1115, and the outer rows 1016*a* and 1016*b*, 1116*a* and 1116*b* generate different frequency signals (e.g., Frequency_CenterRow~2*Frequency OuterRow). In FIG. 10, both the center row 1015 and outer rows 1016*a* 1016*b* utilize an electrically conductive DML 1050 (which includes an electrode 1071). In FIG. 11, meanwhile, the center-row 1115 is configured without a DML while the outer rows 1116*a* and 1116*b* include DMLs 1150, which include electrodes 1171. Both configurations include stacks of different thicknesses.

When building transducers utilizing the methods described herein, including in the workflows 500, 600 of FIGS. 5 and 6, both the elevation gap width (the distance between the stacks in elevation) and the elevation row width (the elevation width of the stacks themselves), can be adjusted to comport with the requirements of the resultant transducer. Additionally, multi-ROC focus options of a lens can be leveraged to further modify and condition the elevational beam profile or width from the near-field, through the transition zone, to the far-field. Elevation gap size and row width individually impact the beam pattern of a transducer comprising the aspects described herein.

Regarding the effect of the elevation gap size on the beam pattern, FIG. 12 is a plot that illustrates the impacts of different gap sizes in a transducer on beam patterns. This example is provided for illustrative purposes only and only includes certain configurations as additional configurations can be built utilizing the methods disclosed herein. FIG. 12 depicts the wider the gap, the wider the elevation beam width in the "transition zone" (e.g., near-field to far-field transition, which is approximately 10-15 mm in this example). Also, the wider the gap, the narrower the beam in the far-field. Specifically, FIG. 12 contrasts resultant –3 dB elevation beam profiles of a 3-row 1.25D array for various gap size values between center row and outer rows of a transducer comprising the aspects described herein. These non-limiting examples also utilize a fixed focus lens. In FIG. 12, the solid lines are the resultant elevation beam profiles, where only the center-row is turned on for depth up to 15 mm, and all 3-rows are turned on for depth beyond 10-15 mm. The different lines represent different kerf widths in-between the center row and the outer rows (e.gs., 0 mils, 5 mils, 10 mils, 20 mils). In the example, the second-listed item, all rows with 0 mils-gap without electronic control, and the third-listed item, all rows with 0 mils-gap and electronic control, overlap in the far-field. The far-field represents deeper depth.

FIG. 13 contrasts both row and elevation gap width adjustments to illustrate resultant –3 dB elevation beam profiles of a 3-row 1.25D array with 10 mils-gap for various outer-row element-width values. FIG. 13 depicts that by adjusting the outer row width, the elevation beam width in the transition zone (e.g., ~10-15 mm) can be significantly reduced. Thus, depending upon the desired clinical applications, the row gap width and the row element width values can be adjusted to fit the different needs. This feature can significantly alleviate the manufacturing challenges in maintaining very small gap size. FIG. 13 depicts simulated elevation beam profile results for 10 mils gap, where the different lines represent various outer-row width (0.6 mm, 0.8 mm, 1.0 mm). The multi-frequency features disclosed herein can benefit imaging penetration. Additionally, the multi-frequency features illustrated in FIGS. 7-9 and the aforementioned multi-ROC focus options of the lens can also be leveraged for further modifying and conditioning the elevation beam profile (e.g., width) from the near-field, through the transition zone, to the far-field. In the example, the second-listed item, all rows with 0 mils-gap without electronic control, and the third-listed item, all rows with 0 mils-gap and electronic control, overlap in the far-field. The far-field represents deeper depth.

FIG. 14 illustrates a benefit of the present invention that was discussed earlier in (e.g., see FIG. 10, transducer 1000 and FIG. 11, transducer 1100) that multiple clinical needs can be met with a single transducer (utilizing the arrays disclosed herein) because the embodiments herein significantly broaden transducer frequency ranges compared to conventional transducers. As such, FIG. 14 illustrates a sample frequency spectrum for a multi-frequency and multi-row transducer fabricated in accordance with aspects of the methods disclosed herein. This example features a comparison between two different transducers, 1410, 1420 to illustrate the broadened frequency range of a transducer that incorporates aspects of the present invention.

FIGS. 15-18 provide additional examples of workflows that include various aspects of methods of fabricating the multi-frequency and multi-row transducer described herein. These workflows include different variations on certain of the aspects described previously. Aspects of these methods can be utilized to fabricate certain of the transducers depicted in FIGS. 2-4, and 7-11. These workflows 1500, 1600, 1700, 1800 are provided as additional, non-limiting examples.

FIGS. 15-17 depicts workflows 1500, 1600, and 1700, that illustrates a method of fabricating the multi-frequency and multi-row transducers described herein, including the transducers of FIGS. 7-9. The workflows 1500, 1600, and 1700 of FIG. 15, FIG. 16, and FIG. 17 respectively, are particularly relevant to FIGS. 7-9 because the thicknesses of the piezoelectric (acoustic) layers 741, 742, 841, 842, 941, 942 illustrated in FIGS. 7-9 are different. In each transducer 700, 800, 900 example illustrated, the thicknesses of the various piezoelectric layers in that example are not the same across the example. The workflows 1500, 1600, and 1700 can be utilized to fabricate transducers with piezoelectric layers of varied thicknesses as well as to fabricate transducers with piezoelectric layers of the same thickness. However, the opposite is not the case as the workflows discussed earlier cannot be utilized to fabricate transducers where the thickness of the piezoelectric layers is inconsistent. Therefore, workflow 1500, workflow 1600, and workflow 1700 are especially relevant to fabricating the transducers of FIGS. 7-9.

To perform the workflow 1500 of FIG. 15, one (e.g., an individual and/or machine) casts and machines a backing block with embedded grounds and signals into a U-shaped (in elevation) backing block (1510). In some examples, when casting and machining, the individual and/or machine orients the grounds at the top of the backing block and the signals at the bottom of the backing block. As illustrated herein, certain transducers fabricated in accordance with the methods described herein include stacks of different heights. To accommodate these differences, in some embodiments of the present invention, the individual and/or machine, can machine the bottom of the U-shaped block with fissures of different heights. The individual and/or machine bonds piezoelectric layers into the backing block inside the U-shape (1520). As aforementioned, these can be of different thicknesses (as this particular workflow 1500 can be used to fabricate transducers that include piezoelectric layers of a consistent thickness as well as piezoelectric layers of different thicknesses). If wider gaps are desired for the transducer, the individual and/or machine dices the piezoelectric layers along an azimuth direction (e.g., perpendicular to an elevation direction as depicted in FIG. 1), into multiple rows (1530). In some examples, this dicing can be skipped if the existing gaps are sufficient for the intended purpose. In earlier examples, this dicing separated the piezoelectric layer into distinct portions, which can be referred to as strippers, but in this workflow 1500, the piezoelectric layers are already separated before being bonded to the backing block (to accommodate piezoelectric layers of different thicknesses as well as those of consistent thicknesses). The individual and/or machine joins each portion of the piezoelectric layer to one or more matching layers (1540). In this example, the first matching layer has a conductive surface that can be bonded to the piezoelectric layer. In some examples, the conductive element of the conductive surface is an embedded electrode.

Without cutting through the conductive surface (which can include the aforementioned electrode), the individual and/or machine dices the matching layers along a multi-row direction (e.g., in elevation) (1550). The individual and/or machine dices the piezoelectric transducer along an elevation direction (e.g., in azimuth) into multiple columns, separating the piezoelectric layers into distinct portions or strippers by cutting through all the matching layers, each piezoelectric layers, and into the backing material (1560). The individual and/or machine fills portions between the rows and the columns created by the elevation dicing and the azimuth dicing (1570).

FIG. 16 is a workflow 1600 that illustrates a method of fabricating the multi-frequency and multi-row transducer described herein. As aforementioned, like workflow 1500 in FIG. 15, workflow 1600 can be utilized to fabricate a transducer with piezoelectric layers of varying thicknesses. In the workflow 1600, an individual and/or machine casts and machines a backing block with embedded grounds and signals into a backing block with multiple U-shaped slots in elevation with the grounds at the top of the backing block and the signals at the bottom of the backing block (1610). The individual and/or machine dices piezoelectric layers in elevation into multiple rows forming distinct strippers (1620). As noted above, the piezoelectric layers can have different thicknesses. Dicing the piezoelectric layer in this manner separates the piezoelectric layer into distinct portions or strippers. The individual and/or machine places strippers (formed by the dicing) into the machined slots in the backing block (1630). The individual and/or machine bonds one or more matching layers to the strippers (1640). In this example, the first matching layer bonded to the strippers has a conductive electrode, which creates an initial bond to bond the first matching layer to this conductive element. The individual and/or machine dices the matching layers along a multi-row direction (e.g., in elevation) to completely cut through the conductive electrode on the first matching layer surface (1650). The individual and/or machine further dices the piezoelectric transducer along an elevation direction (e.g., in azimuth) to form multiple columns (1660). This type of dicing can be characterized as deep dicing as this dicing separates the piezoelectric material into strippers by cutting through all the matching layers. Fill the gaps and kerfs created by the dicing (1670).

FIG. 17 depicts a workflow 1700 that illustrates various aspects of some embodiments of the present invention, specifically of a method of fabricating the multi-frequency and multi-row transducer described herein. As depicted in FIG. 17, to perform this workflow 1700, an individual and/or machine embeds signal flexes and ground-return flexes inside a backing block (1710). The individual and/or machine forms stack configurations by dicing piezoelectric layers in elevation into multiple rows and aligning the diced portions at a distance from each other on the backing block (forming gaps) (1720). As noted above, the piezoelectric layers can vary in thickness (as this workflow 1700 can be utilized in this circumstance as can workflow 1500 and workflow 1600). In some examples, the workflow 1700 includes machining multiple U-shaped slots in the backing block with different heights for the center row versus the outer rows to provide, eventually, a flat surface at the front of transducer (e.g., at the outermost matching layer surface) after adding all the stacks together. Then, the individual and/or machine aligns the stacks with different thicknesses inside slots at a distance from each other on the backing block (forming gaps). The individual and/or machine bonds one or more matching layers to the diced piezoelectric layer portions mentioned earlier in this paragraph (1730). This bonding couples a conductive surface of one of the matching layers to a surface of each of the diced piezoelectric layer portions. The individual and/or machine removes a portion of the one or more matching layers to form cavities (or gaps) in the portion of the one or more layers in elevation to form structures (1740). In some examples, the cavity separates the whole of the layer structure into pieces but in some examples, the matching layers and/or conductive surface remains intact in elevation. The individual and/or machine dices the structures in azimuth into multiple columns (with kerfs in-between) to form the final multi-dimensional array (1750). The stack elements each have a height in the elevation and a width perpendicular to the height. Fill the cavities (gaps) and kerfs with a material (1760).

FIG. 18 is a workflow 1800 that illustrates a method of fabricating the multi-frequency and multi-row transducer described herein. It is most similar to the workflow 1700 illustrated in FIG. 17. The workflow 1800 of FIG. 18 includes more specific (but non-limiting) examples than the workflow 1700 of FIG. 17 and is provided for illustrative purposes, only. While FIGS. 15-17 can be utilized when the thicknesses of piezoelectric layers are both equivalent and different, FIG. 18 serves to illustrate an example where the thicknesses of piezoelectric layers are different. To start the workflow 1800, an individual and/or machine embeds signal flexes and ground-return flexes inside a backing block (1810). One can machine multiple U-shapes into the backing block. Returning to the workflow 1800, the individual and/or machine forms stack configurations by dicing piezoelectric layers with different thicknesses into multiple rows and aligns the diced portions on the backing block to form gaps in-between the stacks, or aligns and bonds the stacks with different thicknesses inside slots at a distance from each other on the backing block (1820). The individual and/or machine bonds one or more matching layers to the (now) diced piezoelectric layers (1830). In this example, the first matching layers include conductive electrodes, so one can connect the first matching layers of center and outside rows (of the multiple rows formed) to the piezoelectric layers and the ground returns in the U-shapes' shoulders. A machine or user conducting the workflow 1800 removes a portion of the one or more matching layers to form cavities in a portion of the one or more layers in elevation (1840). In some examples, removing the portions including forming cutting completely through the one or more layers in elevation to improve isolation between the multiple rows. The individual and/or machine further dices the transducer by dicing the separate rows in azimuth into multiple columns to form the final multi-dimensional array (1850). The stack elements each have a height in elevation and a width perpendicular to the height. The user or machine fills the cavities and gaps (from dicing) with a material (1860).

FIG. 19 is a workflow 1900 that is provided to include some additional details relevant to certain examples of transducer fabrication processes illustrated herein. In this workflow 1900, a machine and/or individual embeds two grounds and multiple signals into a backing block with the two grounds located close to the edges in elevation (1910). The machine and/or individual machines the block into one or multiple U-shaped slots and exposes leads at the tops and bottoms of the U-shaped slots (1920). The machine and/or individual bonds one or multiple piezoelectric layers to U-shaped slots of the backing block (1930). The machine and/or individual separates the piezoelectric layers into distinct portions or strippers with defined gaps between rows either by dicing one or more piezoelectric layers in elevation or by machining gaps in-between the U-shaped slots (1940). The machine and/or individual joins the grounds of the one or more piezoelectric layers together by bonding one or more matching layers to the one or more piezoelectric layers, with a conductive electrode surface on the first matching layer which is close to the one or more piezoelectric layers (1950). The machine and/or individual dices the matching layers along multi-row direction and remove portions without cutting through the conductive electrode on the first matching layer (1960). The machine and/or individual (e.g., deep) dices the multi-row stacks along an elevational direction into multiple columns (e.g., elements) (1970). The machine and/or individual fills portions where the matching layers were removed and where kerfs were formed from the (e.g., deep) dicing (1980).

Figure 20:
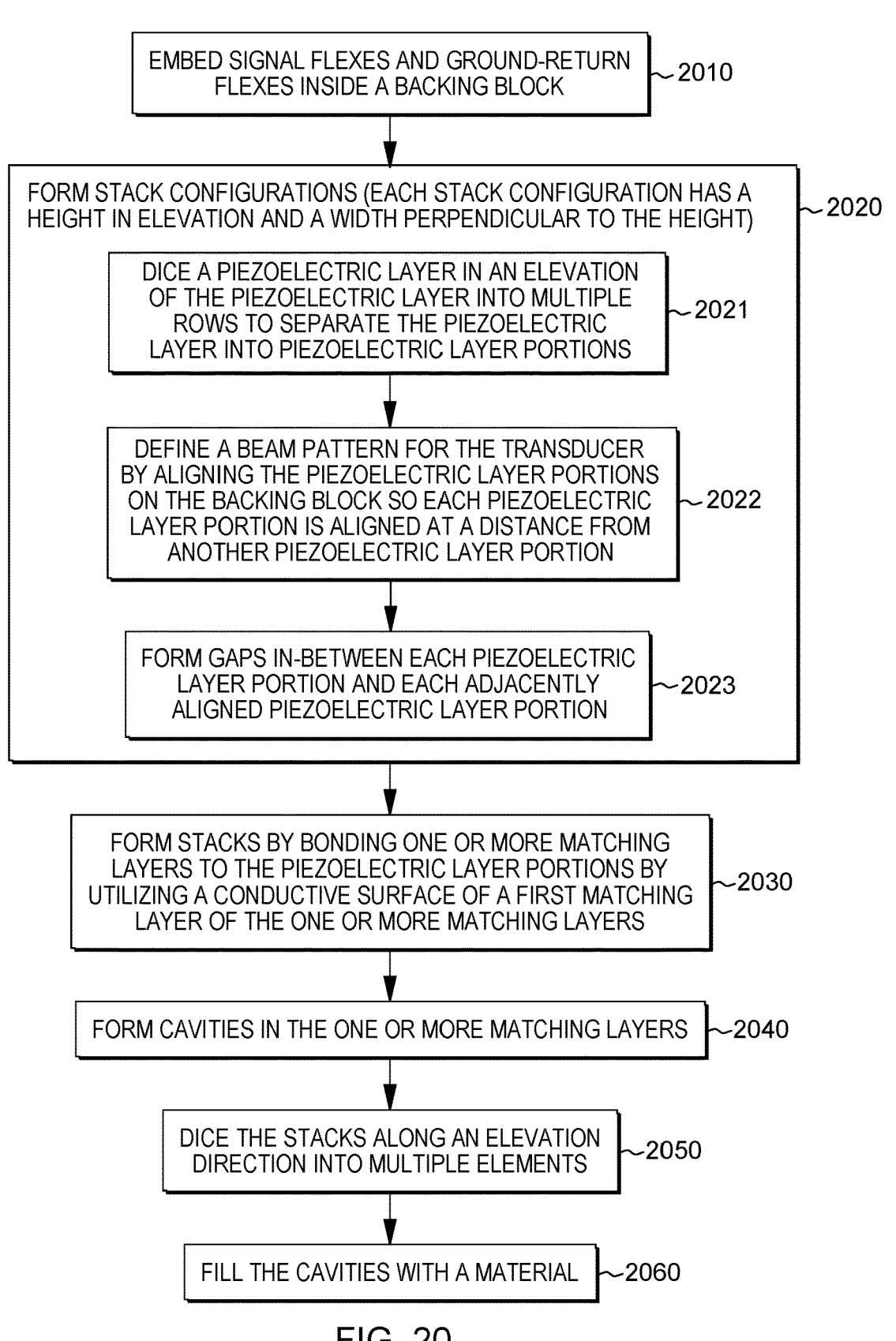
FIG. 20 depicts a workflow for fabricating a transducer in accordance with some aspects of some embodiments of the present invention.

FIG. 20 is a workflow 2000 that illustrates various aspects of an example of the method disclosed herein. In some examples herein, the method includes a machine and/or individual embedding signal flexes and ground-return flexes inside a backing block (2010). The machines and/or individual forms stack configurations; each stack configuration has a height in elevation and a width perpendicular to the height (2020). As illustrated in FIG. 20, in this example, a machine and/or individual forms the stack configurations by performing different activities. The machine and/or individual dices a piezoelectric layer in an elevation of the piezoelectric layer into multiple rows; the dicing separates the piezoelectric layer into piezoelectric layer portions (2021). The machine and/or and individual defines a beam pattern for the transducer by aligning the piezoelectric layer portions on the backing block so each piezoelectric layer portion is aligned at a distance from another piezoelectric layer portion (2022). Based on the aligning, the machine and/or individual forms gaps in-between each piezoelectric layer portion and each adjacently aligned piezoelectric layer portion (2023). In this example, subsequent to a machine and/or individual forming the stack configurations, the machine and/or individual forms stacks by bonding one or more matching layers to the piezoelectric layer portions by utilizing a conductive surface of a first matching layer of the one or more matching layers (2030). The machine and/or individual forms cavities in the one or more matching layers (2040). The machine and/or individual dices the stacks along an elevational direction into multiple elements (2050). The machine and/or individual fills the cavities with a material (2060).

Described herein are several array architectures and interconnection schemes for fabricating multi-row (e.g., 1.25D, 1.5D, 1.75D, etc.) and multi-frequency transducers. During the fabrication process, gaps between rows can be as wide as up to several wavelengths, and both the gap and row widths can be adjusted to change the beam pattern. These fabrication methods provide a flexible means of controlling the beam patterns to meet various clinical needs on resolution and penetration by adjusting not only the multi-row widths as in traditional multi-row 1.25D, 1.5D or 1.75D array design, but also the gaps between the rows. In this manner, various beam pattern requirements for different clinical applications can be satisfied by making these adjustments. Slight thickness differences in the piezoelectric material (layers) between the center row and the outside rows can be used to compensate mismatches of impedances. For example, when the gap between a center row and an outside row is big, the width of the center row might smaller than the combination of the two outside rows. Reducing the thickness of the piezoelectric layer in a center row can make the electrical impedance of the center row match the electrical impedance of the outside rows more closely.

The usability of the transducers is increased, when compared to existing transducers, because by adding the multi-frequency features into traditional multi-row transducers, frequency ranges can be significantly broadened so that the transducer frequency ranges serve multiple clinical applications. Thus, rather than multiple transducers, a single transducer, because of the range of frequencies, can be utilized for multiple clinical applications. A known challenge of transducers is connecting electrical to acoustic elements, but this issue is simplified in the processes described herein because, as illustrated in FIGS. 5-6, the fabrication processes described herein can include embedding both signal flexes and ground-return flexes inside a backing block. These methods herein are compatible with certain known fabrication processes thus changes for advanced, high performance, multi-row transducers can be integrated into the processes in a cost-effective manner because of limited modifications being introduced.

Embodiments of the present invention include transducers and methods of fabricating these transducers. In some examples of the method, the method includes embedding signal flexes and ground-return flexes inside a backing block. The method also includes forming stack configurations, where each stack configuration has a height in elevation and a width perpendicular to the height, where the forming comprises: dicing a piezoelectric layer in an elevation of the piezoelectric layer into multiple rows, the dicing separating the piezoelectric layer into piezoelectric layer portions; defining a beam pattern for the transducer by aligning the piezoelectric layer portions on the backing block, wherein each piezoelectric layer portion is aligned at a distance from another piezoelectric layer portion; and based on the aligning, forming gaps in-between each piezoelectric layer portion and each adjacently aligned piezoelectric layer portion. The method includes forming stacks by bonding one or more matching layers to the piezoelectric layer portions by utilizing a conductive surface of a first matching layer of the one or more matching layers. The method also includes forming cavities in the one or more matching layers. The method includes dicing the stacks along an elevation direction into multiple elements. The method includes filling the cavities with a material.

In other examples of the method for fabricating a transducer, the method also includes embedding signal flexes and ground-return flexes inside a backing block. These examples include forming stack configurations, where each stack configuration has a height in elevation and a width perpendicular to the height, where the forming comprises: dicing a piezoelectric layer comprising front electrodes in an elevation piezoelectric layer into multiple rows, wherein the dicing separates the piezoelectric layer into piezoelectric layer portions; aligning the piezoelectric layer portions on the backing block, wherein each piezoelectric layer portion is aligned at a distance from another piezoelectric layer portion; and based on the aligning, forming gaps in-between each piezoelectric layer portion and each adjacently aligned piezoelectric layer portion. The method also includes forming multiple row stacks, wherein the forming comprises: bonding one or more matching layers to the piezoelectric layer portions by utilizing a conductive surface of a first matching layer of the one or more matching layers; connecting the front electrodes with the ground-returns through the conductive surface; forming cavities in the one or more matching layers; and dicing the multiple row stacks along an elevation direction into multiple elements. These examples also include filling the cavities with a material.

In some examples, embedding signal flexes and ground-return flexes inside the backing block includes: machining into one or more slots in the backing block, the signal flexes and the ground-return flexes, where the machining creates one or more slots in the backing block, and wherein forming the stack configurations comprising aligning the stack configurations inside the one or more slots.

In some examples, aligning the piezoelectric layer portions on the backing block includes: positioning each piezoelectric layer portion in a slot of the one or more slots; and filling gaps in-between each piezoelectric layer portion with an additional material.

In some examples, the method includes selecting the material and the additional material from the group consisting of: air, room-temperature-vulcanizing silicone, backing material, and a material mixed with micro-balloons.

In some examples, forming the cavities comprises forming the cavities in portions of the one or more matching layers that include the conductive surface in the elevation, and the method includes: connecting front electrodes of the piezoelectric layer portions with embedded ground-return flexes through the conductive surface.

In some examples, forming the elements includes dicing completely through the stacks along the elevation direction.

In some examples, defining the beam pattern for the transducer includes selecting a width for the gaps between the multiple rows.

In some examples, forming the stack configuration further comprises: bonding a de-matching layer to at least one piezoelectric layer portion.

In some examples, wherein forming stack configurations further comprises: positioning the stack configurations in three rows in the elevation along an azimuthal axis, where each row comprises at least one stack configuration, where the three rows comprise an inner row and two outer rows, where the positioning comprises: selecting for the inner row, at least one stack configuration of a first height, of a first width, and of a first stack-up thicknesses-configuration; and selecting each outer row of the two outer rows, at least one stack configuration of a second height, of a second width, and of a second stack-up thicknesses-configuration.

In some examples, the first height and the second height are equivalent or are not equivalent, and wherein the first width and the second width are equivalent, and wherein the first stack-up thicknesses-configuration and the second stack-up thicknesses-configuration are equivalent or are not equivalent to each other.

In some examples, the method includes attaching a lens to a portion of the one or more matching layers such that the one or more matching layers are located between the piezoelectric layer portions and the lens In some examples, defining comprises defining the beam pattern in an elevational plane.

In some examples, defining the beam pattern for the transducer by aligning the piezoelectric layer portions on the backing block, further comprises: dicing the stacks along the elevational direction into multiple elements; and aligning the multiple elements on the backing block in both an elevation direction and in an azimuth direction.

In some examples, the first height and the second height are equivalent.

In some examples, the first height and the second height are not equivalent

In some examples, first stack-up thicknesses-configuration and the second stack-up thicknesses-configuration are equivalent.

In some examples, first stack-up thicknesses-configuration and the second stack-up thicknesses-configuration are not equivalent.

In some examples, the first width and the second width are equivalent.

In some examples, bonding the one or more matching layers to the piezoelectric layer portions further comprises coupling the piezoelectric layer portions' grounds to the ground-return flexes through the conductive surface of the first matching layer.

In some examples, the conductive surface comprises an electrode.

In some examples, the method includes selecting the lens from the group consisting of: a single radius focus lens and a multiple radii focus lens.

The transducers described herein include a transducer that includes a lens, signal flexes and ground-return flexes inside a backing block, and stack configurations aligned on the backing block. In some examples, the stack configurations include: a piezoelectric layer, where a gap is formed in elevation in-between each piezoelectric layer and each adjacently aligned piezoelectric layer, where each stack configuration has a height in elevation, a width perpendicular to the height, and a stack-up thicknesses-configuration, where the stack-up thicknesses-configuration is perpendicular to the height and perpendicular to the width; and one or more matching layers coupled to the lens and bonded to each piezoelectric layer, where a conductive surface of a matching layer of the one or more matching layers is coupled to a top surface of each piezoelectric layer, where the one or more matching layers comprise one or more cavities, where in the cavities are filled with a material.

In other examples herein, the transducer includes a lens, signal flexes and ground-return flexes inside a backing block, and stack configurations aligned on the backing block. In these examples, each stack configuration of the stack configurations aligned on the backing block in a row of at least two outer rows and a center row. The center row generates a first frequency signal and the at least two outer rows generate a second frequency signal and a frequency of the first frequency signal is not equivalent to a frequency of the second frequency signal. The stack configurations each comprise: a piezoelectric layer, where a gap is formed in elevation in-between each piezoelectric layer and each adjacently aligned piezoelectric layer; and one or more matching layers coupled to the lens and bonded to each piezoelectric layer, where a conductive surface of a matching layer of the one or more matching layers is coupled to a top surface of each piezoelectric layer, where the one or more matching layers comprise one or more cavities, where in the cavities are filled with a material.

In some examples of the transducer, the heights of the stack configurations are equivalent to each other or are not equivalent to each other, where the widths of the stack configurations are equivalent to each other, and where the stack-up thicknesses-configurations are equivalent to each other or are not equivalent to each other.

In some examples of the transducer, at least one stack configuration further comprises a de-matching layer coupled to the piezoelectric layer of the at least one stack configuration.

In some examples of the transducer, the backing block comprises three or more U-shaped trough block sections comprising machined backing shoulder strippers, where the ground-return flexes are embedded into the machined backing shoulder strippers, and where the signal flexes are at a bottom position on the backing block to define connections for the stack configurations.

In some examples of the transducer, the machined backing shoulder strippers comprise two outer machined backing shoulder strippers and two or more inner machined backing shoulder strippers.

In some examples of the transducer, each stack configuration of the stack configurations aligned on the backing block is aligned inside of one or more of the three or more U-shaped trough block sections forming at least two outer rows and a center row.

In some examples of the transducer, the center row generates a first frequency signal and the at least two outer rows generate a second frequency signal.

In some examples of the transducer, a frequency of the first frequency signal is not equivalent to a frequency of the second frequency signal.

In some examples of the transducer, the cavities extend through each layer of the one or more matching layers.

In some examples of the transducer, the cavities do not extend through the conductive surface.

In some examples of the transducer, the material used to fill in the cavities is from the group consisting of: air, room-temperature-vulcanizing silicone, backing material, and a material mixed with micro-balloons.

In some examples of the transducer, the one or more matching layers bonded to each stack configuration have a layer height in the elevation, a layer width perpendicular to the layer height, and a layer-up thicknesses-configuration, where the layer-up thicknesses-configuration is perpendicular to the layer height and perpendicular to the layer width, the one or more matching layers bonded to each stack configuration do not have equivalent layer heights.

In some examples of the transducer, the one or more matching layers have a layer height in the elevation, a layer width perpendicular to the layer height, and a layer-up thicknesses-configuration, where the layer-up thicknesses-configuration is perpendicular to the layer height and perpendicular to the layer width, and the layer width for each matching layer of the one or more matching layers is equivalent.

In some examples of the transducer, the one or more matching layers bonded to each stack configuration has a layer height in the elevation, a layer width perpendicular to the layer height, and a layer-up thicknesses-configuration, where the layer-up thicknesses-configuration is perpendicular to the layer height and perpendicular to the layer width, the one or more matching layers bonded to each stack configuration do not have equivalent layer-up thicknesses-configurations.

In some examples of the transducer, the conductive surface comprises an electrode.

In some examples of the transducer, the stack configurations are aligned on the backing block in both an elevation direction and in an azimuth direction.

In some examples of the transducer, the heights of the stack configurations are equivalent.

In some examples of the transducer, the heights of the stack configurations are not equivalent.

In some examples of the transducer, the widths of the stack configurations are equivalent.

In some examples of the transducer, the widths of the stack configurations are not equivalent.

In some examples of the transducer, the stack-up thicknesses-configurations are equivalent.

In some examples of the transducer, the stack-up thicknesses-configurations are not equivalent.

In some examples of the transducer, the lens is selected from the group consisting of: a single radius focus lens and a multiple radii focus lens.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed.

Many modifications and variations will be apparent to those of ordinary skill in the art. The embodiment was chosen and described to best explain various aspects and the practical application, and to enable others of ordinary skill in the art to understand various embodiments with various modifications as are suited to the particular use contemplated.

What is claimed is:

1. A transducer comprising:
a lens;
signal flexes and ground-return flexes inside a backing block; and
stack configurations aligned on the backing block, wherein the stack configurations each comprise:
   a piezoelectric layer, wherein a gap is formed in elevation in-between each piezoelectric layer and each adjacently aligned piezoelectric layer, wherein each stack configuration has a height in elevation, a width perpendicular to the height, and a stack-up thicknesses-configuration, wherein the stack-up thicknesses-configuration is perpendicular to the height and perpendicular to the width; and
   one or more matching layers coupled to the lens and bonded to each piezoelectric layer, wherein a conductive surface of a matching layer of the one or more matching layers is coupled to a top surface of each piezoelectric layer, wherein the one or more matching layers comprise one or more cavities, wherein the cavities are filled with a material,
wherein the backing block comprises three or more U-shaped trough block sections and each stack configuration of the stack configurations aligned on the backing block is aligned inside of one or more of the three or more U-shaped trough block sections forming at least two outer rows and a center row, and further wherein the center row generates a first frequency signal and the at least two outer rows generate a second frequency signal, and wherein a frequency of the first frequency signal is not equivalent to a frequency of the second frequency signal.

2. The transducer of claim 1, wherein the heights of the stack configurations are equivalent to each other or are not equivalent to each other, wherein the widths of the stack configurations are equivalent to each other, and wherein the stack-up thicknesses-configurations are equivalent to each other or are not equivalent to each other.

3. The transducer of claim 1, wherein at least one stack configuration further comprises a de-matching layer coupled to the piezoelectric layer of the at least one stack configuration.

4. The transducer of claim 1, wherein the three or more U-shaped trough block sections comprise machined backing shoulder strippers, wherein the ground-return flexes are embedded into the machined backing shoulder strippers, and wherein the signal flexes are at a bottom position on the backing block to define connections for the stack configurations.

5. The transducer of claim 4, the machined backing shoulder strippers comprising two outer machined backing shoulder strippers and two or more inner machined backing shoulder strippers.

6. The transducer of claim 1, wherein the cavities extend through each layer of the one or more matching layers.

7. The transducer of claim 1, wherein the cavities do not extend through the conductive surface.

8. The transducer of claim 1, wherein the material used to fill in the cavities is from the group consisting of: air, room-temperature-vulcanizing silicone, backing material, and a material mixed with micro-balloons.

9. The transducer of claim 1, wherein the one or more matching layers bonded to each stack configuration have a layer height in the elevation, a layer width perpendicular to the layer height, and a layer-up thicknesses-configuration, wherein the layer-up thicknesses-configuration is perpendicular to the layer height and perpendicular to the layer width, the one or more matching layers bonded to each stack configuration do not have equivalent layer heights.

10. The transducer of claim 1, wherein the one or more matching layers have a layer height in the elevation, a layer width perpendicular to the layer height, and a layer-up thicknesses-configuration, wherein the layer-up thicknesses-configuration is perpendicular to the layer height and perpendicular to the layer width, and the layer width for each matching layer of the one or more matching layers is equivalent.

11. The transducer of claim 1, wherein the one or more matching layers bonded to each stack configuration have a layer height in the elevation, a layer width perpendicular to the layer height, and a layer-up thicknesses-configuration, wherein the layer-up thicknesses-configuration is perpendicular to the layer height and perpendicular to the layer width, the one or more matching layers bonded to each stack configuration do not have equivalent layer-up thicknesses-configurations.

12. The transducer of claim 1, wherein the conductive surface comprises an electrode.

13. The transducer of claim 1, wherein the stack configurations are aligned on the backing block in both an elevation direction and in an azimuth direction.

14. A transducer comprising:
a lens;
signal flexes and ground-return flexes inside a backing block; and
stack configurations aligned on the backing block, wherein each stack configuration of the stack configurations aligned on the backing block in a row of at least two outer rows and a center row, wherein the center row generates a first frequency signal and the at least two outer rows generate a second frequency signal, wherein a frequency of the first frequency signal is not equivalent to a frequency of the second frequency signal, and wherein the stack configurations each comprise:
   a piezoelectric layer, wherein a gap is formed in elevation in-between each piezoelectric layer and each adjacently aligned piezoelectric layer; and
   one or more matching layers coupled to the lens and bonded to each piezoelectric layer, wherein a conductive surface of a matching layer of the one or more matching layers is coupled to a top surface of each piezoelectric layer, wherein the one or more matching layers comprise one or more cavities, where in the cavities are filled with a material.

15. The transducer of claim 14, wherein the widths of the stack configurations are equivalent to each other.

16. The transducer of claim 14, wherein three or more U-shaped trough block sections of the backing block comprise machined backing shoulder strippers, wherein the ground-return flexes are embedded into the machined backing shoulder strippers, and wherein the signal flexes are at a bottom position on the backing block to define connections for the stack configurations.

17. The transducer of claim 16, the machined backing shoulder strippers comprising two outer machined backing shoulder strippers and two or more inner machined backing shoulder strippers.

18. The transducer of claim 14, wherein the one or more matching layers bonded to each stack configuration have a layer height in the elevation, a layer width perpendicular to the layer height, and a layer-up thicknesses-configuration, wherein the layer-up thicknesses-configuration is perpendicular to the layer height and perpendicular to the layer width, the one or more matching layers bonded to each stack configuration do not have equivalent layer heights.

19. The transducer of claim 14, wherein the one or more matching layers have a layer height in the elevation, a layer width perpendicular to the layer height, and a layer-up thicknesses-configuration, wherein the layer-up thicknesses-configuration is perpendicular to the layer height and perpendicular to the layer width, and the layer width for each matching layer of the one or more matching layers is equivalent.

20. The transducer of claim 14, wherein the one or more matching layers bonded to each stack configuration have a layer height in the elevation, a layer width perpendicular to the layer height, and a layer-up thicknesses-configuration, wherein the layer-up thicknesses-configuration is perpendicular to the layer height and perpendicular to the layer width, the one or more matching layers bonded to each stack configuration do not have equivalent layer-up thicknesses-configurations.

* * * * *